US 6,667,486 B2

(12) United States Patent
Ohta et al.

(10) Patent No.: US 6,667,486 B2
(45) Date of Patent: Dec. 23, 2003

(54) ELECTRON BEAM EXPOSURE METHOD, ELECTRON BEAM EXPOSURE APPARATUS AND DEVICE MANUFACTURING METHOD USING THE SAME

(75) Inventors: Hiroya Ohta, Kodaira (JP); Yasunari Sohda, Kawasaki (JP); Norio Saitou, Tokorozawa (JP); Haruo Yoda, Hinodemachi (JP); Yoshikiyo Yui, Utsunomiya (JP); Shin'ichi Hashimoto, Ageo (JP)

(73) Assignees: Hitachi, Ltd., Tokyo (JP); Canon Kabushiki Kaisha, Tokyo (JP); Advantest Corporation, Tokyo (JP)

( * ) Notice: Subject to any disclaimer, the term of this patent is extended or adjusted under 35 U.S.C. 154(b) by 3 days.

(21) Appl. No.: 10/219,769

(22) Filed: Aug. 16, 2002

(65) Prior Publication Data

US 2003/0189181 A1 Oct. 9, 2003

(30) Foreign Application Priority Data

Apr. 4, 2002 (JP) ........................... 2002-102789

(51) Int. Cl.$^7$ ........................... H01J 37/08; H01J 37/30; H01J 37/302

(52) U.S. Cl. .............................. 250/492.22; 250/492.1; 250/492.2; 250/492.23; 250/492.3; 250/396 R; 250/398

(58) Field of Search ........................ 250/492.22, 492.2, 250/492.23, 492.3, 492.1, 396 R, 398; 430/296, 30

(56) References Cited

U.S. PATENT DOCUMENTS

| | | | | |
|---|---|---|---|---|
| 4,647,782 A | * | 3/1987 | Wada et al. ............. | 250/492.2 |
| 4,837,447 A | * | 6/1989 | Pierce et al. ............. | 250/492.2 |
| 4,897,552 A | * | 1/1990 | Okunuki et al. ......... | 250/492.2 |
| 5,005,138 A | * | 4/1991 | Tobuse et al. ........... | 250/492.2 |
| 5,448,075 A | * | 9/1995 | Fueki et al. ............. | 250/492.22 |
| 5,449,915 A | * | 9/1995 | Yamada et al. ............. | 250/397 |
| 5,929,454 A | * | 7/1999 | Muraki et al. ........... | 250/491.1 |
| 6,137,113 A | * | 10/2000 | Muraki ................... | 250/492.22 |
| 6,225,025 B1 | * | 5/2001 | Hoshino .................... | 430/296 |
| 6,242,751 B1 | * | 6/2001 | Takemoto et al. ...... | 250/492.22 |
| 6,274,877 B1 | * | 8/2001 | Muraki ................... | 250/492.23 |
| 6,313,163 B1 | * | 11/2001 | Vuligonda et al. .......... | 514/432 |
| 6,559,456 B1 | * | 5/2003 | Muraki .................... | 250/491.1 |
| 2002/0008207 A1 | * | 1/2002 | Muraki et al. ............. | 250/398 |
| 2003/0062489 A1 | * | 4/2003 | Abe ....................... | 250/492.23 |
| 2003/0093767 A1 | * | 5/2003 | Murai et al. .................. | 716/21 |

FOREIGN PATENT DOCUMENTS

JP 09-245708 3/1996

* cited by examiner

*Primary Examiner*—John R. Lee
*Assistant Examiner*—Bernard E. Souw

(57) ABSTRACT

The present invention provides a high-precision and high-speed electron beam exposure technique which corrects the position of each beam in a multi-beam exposure method without using a deflection array and a huge and high-precision driving circuit. In an electron beam exposure method for forming a desired pattern onto a specimen by independently controlling emission and scanning of a plurality of electron beams, a deviation between a pattern formed by each of the plurality of electron beams and the desired pattern is controlled by shifting the position of pattern data of the pattern formed by each of the plurality of electron beams.

8 Claims, 21 Drawing Sheets

DISTORTION  MAGNIFICATION  ROTATION

ELECTRON BEAM EXPOSURE METHOD, ELECTRON BEAM EXPOSURE APPARATUS AND DEVICE MANUFACTURING METHOD USING THE SAME

BACKGROUND OF THE INVENTION

The present invention relates to an electron beam exposure technique used for processing and exposing a semiconductor integrated circuit or the like.

As the packing density of a semiconductor integrated circuit typified by an LSI is becoming higher, a circuit pattern to be formed is rapidly becoming finer. Particularly, it is very difficult to form a pattern of a node of 100 nm or less by an extension of conventional photolithography.

Although electron beam exposure is effective means for forming a micropattern, to apply the technique to a manufacturing site higher throughput is demanded. In recent years, broadly, two methods have been being studied and developed as means for improving the throughput of electron beam exposure. One of the methods is a method of forming a pattern by projecting an electron beam by using a stencil mask. According to the method, although higher throughput can be expected, it is difficult to fabricate the mask, and high cost is estimated.

A second method relates to a method of writing a pattern at once by simultaneously using a plurality of point beams or variable rectangular beams as a conventional electron beam exposure method. In this specification, a method of assigning one electron beam to one electron optical system including an electron lens and a deflector and using a plurality of electron optical systems is defined as a multi-column system, and a method of emitting a plurality of beams to a single electron optical system is defined as a multi-beam system.

An example of the electron beam exposure of the multi-beam system is disclosed in Japanese Patent Application Laid-Open No. 9-245708. An electron beam emitted from a single electron source is condensed to a parallel beam by a condenser lens, and the parallel beam is divided into a plurality of electron beams by an aperture array. From the beams, an intermediate image is formed by a lens array and a deflector array, and the beams are independently emitted by a blanking array. After that, the intermediate image is projected onto a specimen by a projection optical system including a deflector. The system is an innovative system realizing higher resolution and higher throughput since a curvature of field, distortion, or the like which occurs in the projection optical system can be preliminarily corrected by a lens array and a deflector array and it facilitates designing of the projection optical system.

However, according to the multi-beam exposure method, due to a mechanical manufacturing error of the aperture array, lens array, or projection optical system, oblique incidence with respect to an ideal beam center axis caused by the mechanical manufacturing error, or the like associated with the mechanical manufacturing error, intervals of multi-beams may not equal to a predetermined value expected in design. Naturally, variations in beam intervals can be corrected by deflecting the position of each beam by the deflector array. Since an electrostatic deflector of four or more poles which is small is used due to limitation of a space, wiring is difficult, and four or more high-precision analog driving, circuits are necessary per beam. To correct a positional shift of a beam caused by magnification, rotation, or distortion which occurs in association with deflection synchronized with exposure and fluctuations in sample height, a high-speed driving circuit is necessary.

When the number of multi-beams of the multi-beam exposure system is set to 1000 to 4000, the circuit scale becomes large, the number of wires connecting the driving circuit and the deflector array becomes large, and mounting becomes very difficult.

SUMMARY OF THE INVENTION

The invention has been achieved in consideration of the problems and its object is to provide a high-precision and high-speed electron beam exposure technique capable of correcting the position of each beam with a simple configuration in a multi-beam exposure system.

To achieve the object, the invention provides an electron beam exposure method for forming a desired pattern onto a specimen by independently emitting and scanning a plurality of electron beams, wherein a deviation between a pattern formed by each of the plurality of electron beams and the desired pattern is controlled by shifting the position of pattern data of the pattern formed by each of the plurality of electron beams.

The invention also provides an electron beam exposure method for forming a desired pattern on a specimen by independently controlling emission and scanning of a plurality of electron beams, including: a step of adding a second region corresponding to a deflection region margin to the periphery of a first region including the desired pattern to be formed by each of the plurality of electron beams, thereby setting a pattern of a third region; a step of obtaining a positional shift amount of pattern data of a pattern formed by each of the plurality of electron beams from pattern data of the desired pattern in the third region; and a step of deflecting each of the plurality of electron beams in accordance with the positional shift amount in the third region.

The invention also provides an electron beam exposure apparatus for forming a desired pattern by independently controlling emission of a plurality of electron beams so as to fall on a specimen via a projection optical system including a deflector, including: a memory for storing pattern data of the desired pattern to be formed by each of the plurality of electron beams; a shift amount computing circuit for computing a positional shift amount of pattern data of a pattern formed by each of the plurality of electron beams from the pattern data of the desired pattern; and deflection control means for deflecting each of the plurality of electron beams in accordance with the positional shift amount.

The invention also provides an electron beam exposure apparatus for forming a desired pattern by independently controlling emission of a plurality of electron beams so as to fall on a specimen via a projection optical system including a deflector, including: a memory for storing pattern data of a third region obtained by adding a second region corresponding to a deflection region margin to the periphery of a first region including the desired pattern to be formed by each of the plurality of electron beams; a shift amount computing circuit for computing a positional shift amount of pattern data of a pattern formed by each of the plurality of electron beams in the third region from the pattern data of the desired pattern; and deflection control means for deflecting each of the plurality of electron beams in accordance with the positional shift amount in the range of the third region.

The positional shift amount of the pattern data includes an amount of correcting variations in intervals of the plurality of electron beams, or an amount of correcting a positional shift of each of the plurality of electron beams, which occurs due to a whole electron optical system including the projection optical system or due to fluctuations in height of the specimen.

The apparatus further includes means for synchronizing computation of the positional shift amount of the pattern and a deflecting operation for exposure with each other.

The means for computing the positional shift amount of the pattern is constructed by means for performing pattern data linear interpolation, and the apparatus includes irradiation amount control means for converting the result of the linear interpolation to an irradiation amount.

The pattern shift amount computing means can set the shift amount by depending on a deflection position for exposure.

The size of the second region for performing the pattern positional shift computation, to be added to the periphery of the first region including the desired pattern to be formed by each of the electron beams is changeable depending on the deflection position for exposure in the memory.

DETAILED DESCRIPTION OF THE PREFERRED EMBODIMENTS

Embodiments of the invention will be described in detail hereinbelow with reference to the drawings.

Figure 2:
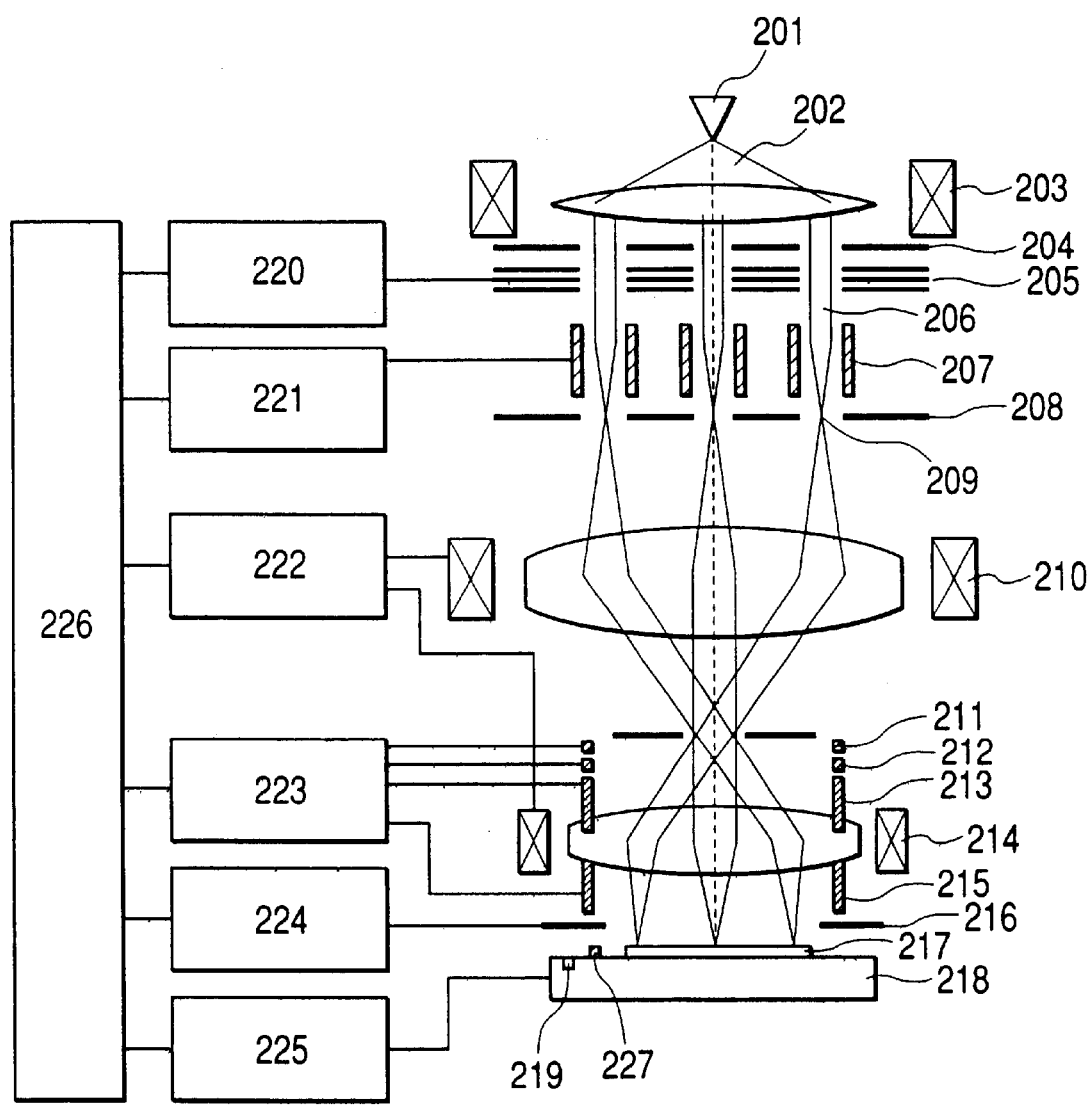
FIG. 2 is a diagram showing an example of an electron beam exposure apparatus of a multi-beam system.

First, the configuration of an electron beam exposure apparatus used in the invention will be described. FIG. 2 shows an example of the electron beam exposure apparatus of a multi-beam,system.

Electron beams 202 emitted from an electron gun 201 are condensed to almost parallel electron beams by a condenser lens 203. The electron gun 201 includes a cathode, an anode, and a grid (which are not shown), and its crossover size can be changed according to a voltage applied. The almost parallel electron beams are separated by an aperture array 204 into electron beams 206 which form intermediate images 209 of the crossover of the electron gun near a blanking aperture 208 by a lens array 205 driven by a focus control circuit 220. The positions in the optical axial direction of each of the intermediate images 209 can be changed by changing the focal length of each of the lens array 205.

By applying a voltage to a blanking array 207, the intermediate image 209 moves in the direction perpendicular to the optical axis and is interrupted by the blanking aperture 208. In such a manner, whether each of the separated electron beams 206 is emitted or not can be controlled. In this case, an electron optical system including elements of one lens array, one blanking array, and one blanking aperture per beam separated by the aperture array 204 will be called an element electron optical system. The details of the element electron optical system will be described hereinlater.

The intermediate images 209 are projected onto a specimen 217 on a specimen stage 218 by a projection optical system including a first projection lens 210 and a second projection lens 214. The projection optical system is driven by a lens control circuit 222 so as to share the posterior focal point position of the first projection lens 210 and the anterior focal point position of the second projection lens 214. This arrangement is called a symmetrical magnetic doublet configuration, and an image can be projected with a low aberration.

In $LaB_6$ which is the most used as an electron source for electron beam exposure, the crossover size of the electron gun is about 10 $\mu$m. To set the beam size on a specimen to 10 nm, the beam has to be reduced to $\frac{1}{1000}$. Assuming now that the magnification of the lens array is $\frac{1}{20}$, the projection optical system needs a magnification of $\frac{1}{50}$. The magnification may not be realized by a set of projection lenses. In such a case, two sets of projection lenses are used and, for example, the magnification of the first stage is set to $\frac{1}{10}$, and that of the second stage is set to $\frac{1}{5}$. Between the blanking aperture 208 and the first projection lens 210 shown in FIG.

2, a projection lens is disposed. The projection lens also has the symmetric magnetic doublet configuration.

A plurality of electron beams 206 are deflected in a lump by a main deflector 213 and a sub deflector 215 so as to be positioned. For example, the deflection width of the main deflector 213 is set to be wide, and that of the sub deflector 215 is set to be narrow. The main deflector 213 is of an electromagnetic type, and the sub deflector 215 is of an electrostatic type. A focal point deviation due to a deflection aberration is corrected by a dynamic focal point corrector 211, and a deflection astigmatism which is caused by deflection is corrected by a dynamic astigmatism corrector 212. Each of the focal point corrector and the astigmatism corrector is constructed by a coil.

Exposure is made by moving the specimen 217 mounted on the specimen stage 218. Reference numeral 219 denotes a Faraday cup which is mounted on the specimen stage and has knife edges in the X and Y directions. The Faraday cup 219 measures a charge amount synchronously with deflection of an electron beam on the specimen or movement of the Faraday cup 219 interlocking with the stage control circuit 225 including a coordinate measuring function (not shown) such as a laser interferometer, thereby enabling the position of the electron beam to be measured on the specimen, which forms the intermediate images. The position of an electron beam can be measured also by a method of attaching a mark 227 for position measurement onto the specimen stage, scanning the mark 227, detecting a signal of an electron detector 216, and processing the signal by a signal processing circuit 224. On the basis of the measured beam position, a shift amount of each beam is computed.

By synchronizing the irradiation control of the beam by an irradiation amount control circuit 221 based on pattern data stored in a CPU 226 and the deflection operation of the main deflector 213 and the sub deflector 215 driven the a deflection control circuit 223, exposure is performed. The specimen stage 218 is moved by continuous movement or step movement via the stage control circuit 225.

The series of operations are controlled by the CPU 226.

The details of the element electron optical system will now be described by referring to FIG. 11.

Figure 11:
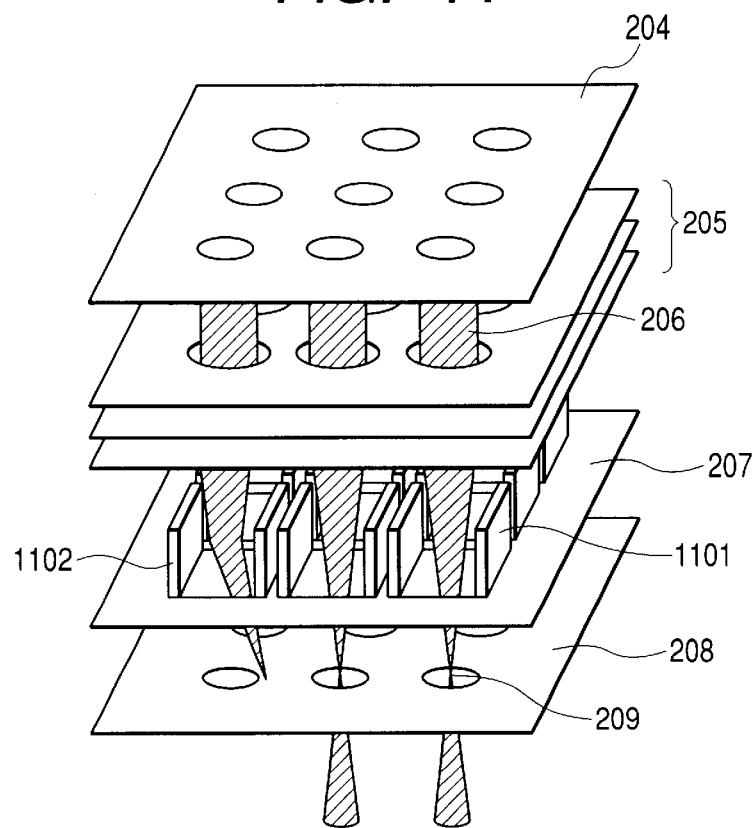
FIG. 11 is a diagram showing the details of an element electron optical system.

FIG. 11 shows a portion from the aperture array 204 to the blanking aperture 208 in FIG. 2, which is seen from obliquely above, and uses the same reference numerals as those in FIG. 2. Almost parallel electron beams (not shown) enter the aperture array 204. The electron beams 206 separated by the aperture array 204 are converged by the lens array 205 and the intermediate image 209 is formed near the blanking aperture 208. The lens array 205 is a unipotential lens consisting of three electrodes. Both electrodes are grounded, and a voltage is applied only to the intermediate electrode. For example, the focal distance when an application voltage is 1 kV is about 100 mm.

The pitches of the openings in the aperture array 204, lens array 205, blanking array 207, and blanking aperture 208 are almost the same. For example, when the pitch in the specimen is 4 µm and the magnification of the projection optical system is 1/50, the pitch is 200 µm.

FIG. 11 shows a case where 0V is applied to a blanking electrode 1101 on the blanking array 207, and a specific voltage is applied to a blanking electrode 1102. Beams passed through the blanking electrodes 1101 form intermediate images at the openings of the blanking aperture 209 and reach downstream of the blanking aperture 209. A specific voltage is applied across the blanking electrodes 1102, so that the beams are deflected. The intermediate image reaches the closed portion of the blanking aperture 208 and the way to the downstream is interrupted. As described above, depending on whether a voltage is applied to each blanking electrode or not, whether the beam is passed or not can be controlled. To improve sensitivity, it is efficient to apply voltages of opposite signs of + and − to the facing two electrodes. For example, a voltage from ±5V to ±10V is used in operation of about 100 MHz.

The exposing operation in the exposure apparatus of the embodiment will now be described by referring to FIG. 3. A pattern to be formed on a specimen (wafer in this case) is divided into strap-shaped stripes 301 each having a width in a range which can be deflected by main deflection. The stripes 301 are divided on a sub-field 302 unit basis into main fields 303. Electron beams 304 (64 electron beams in FIG. 3) are deflected by sub deflection and scans the whole sub field 302. An area exposed with one electron beam in the sub field 302 is set as a micro field 305. In the micro field 305, by using, as a unit, a pixel 306 having almost the same size as the diameter of the electron beam 304, deflecting operation like raster scan is performed sequentially from the corner. All of the electron beams in the sub field 302 are deflected in a lump by sub-deflection. By controlling whether each electron beam is passed or not synchronously with deflection on the pixel unit basis, a pattern in the sub field is written.

After completion of exposure of one sub field, deflection is performed by the main deflection only by the amount of a sub field. In a manner similar to the above, the next sub field is exposed. Similarly, the sub fields are exposed and, on completion of exposure in the main deflection range, that is, to the end of the main field, the process shifts to exposure of the next main field. The specimen stage is continuously moved. For example, the size of a pixel is 20 nm, the size of a micro field is a 4 µm square, the size of the sub field is a 256 µm square (corresponding to 64×64 beams), the size of the main field is of 256 µm×4 mm, and the stripe width is 4 mm.

Embodiment 1

An exposure method of the invention will now be described. The interval between neighboring electron beams constructing the sub field is determined by multiplying the interval of the element electron optical systems shown in FIG. 2 by the magnification of the projection optical system. However, there is the possibility that the interval between electron beams constructing the sub filed varies due to variations in the interval according to the processing accuracy of the element electron optical system, a manufacture error of the projection optical system, an error of the incidence angle of each electron beam which occurs in association with the variations in the interval and the manufacture error, and the like. The factors of the errors are fixed. Once all of the electron optical systems are assembled and image forming conditions are set, the beam interval is determined. The beam interval can be measured by using the Faraday cup having knife edges shown in FIG. 2. For example, it is sufficient to store a deviation amount from a predetermined value.

The variations in each electron beam may change with time. In this case, it is sufficient to measure the beam interval at proper time intervals.

Figure 4A:
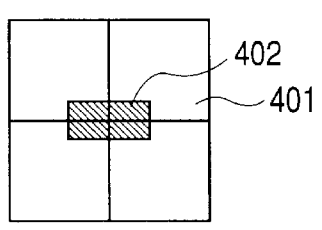
FIGS. 4(A) to 4(F) are diagrams showing an example of taking four micro fields.
Figure 4B:
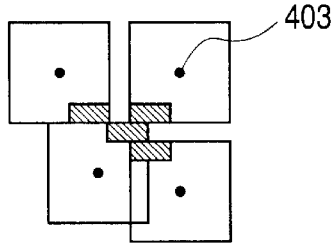
Figure 4C:
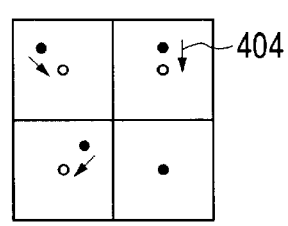

FIGS. 4(A) to 4(F) show an example of four micro fields obtained from a sub field. FIG. 4(A) shows micro fields 401 and a pattern 402 to be formed. For example, when the intervals of four electron beams 403 fluctuate as shown in FIG. 4(B), a deformed pattern is obtained. In contrast, when a deflector is provided independently for each beam and correction 404 is made on the deviation as shown by the arrows in FIG. 4(C), the pattern to be formed is accurately obtained.

Figure 4D:
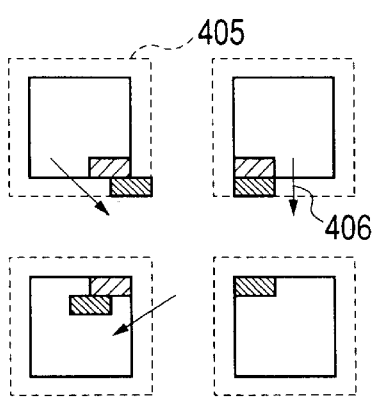
Figure 4E:
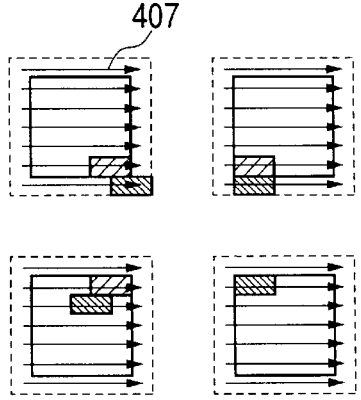
Figure 4F:
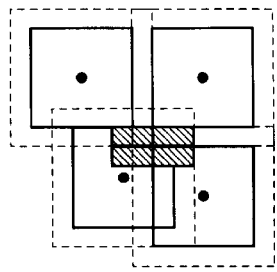

As shown in FIG. 4(D), first, a deflection area margin 405 is provided for each micro field, and the pattern to be formed is subject to shifting 406 in the direction of canceling off the positional shift of the beam in the micro field on the micro field unit basis. After that, as shown in FIG. 4(E), beam deflection 407 is performed on both the micro field and the deflection area margin. Although each beam position is shifted, as shown in FIG. 4(F), the initial pattern to be formed is accurately formed as a result.

The exposure method will be described from the viewpoint of exposure control by referring to FIG. 1. Pattern data stored in a CPU 101 is developed to bit map data of which unit is a pixel shown in FIG. 3 by a bit map developing circuit 102. The developed data is divided on the micro field unit basis and the resultant is stored as irradiation amount data into a bit map memory 103 constructed by the number of micro fields. The bit map memory 103 includes an amount corresponding to the deflection area margin shown in FIG. 4(D). Since there is no pattern in the deflection area margin at this stage, the initial value of 0 is stored.

Subsequently, a shift amount is computed by a shift computing circuit constructed by the bit map memory 103, a bit map shifting circuit 104, and a shift amount control circuit 105. The pattern data of each bit map memory 103 is shifted by the bit map shifting circuit 104. Parameters such as a shift amount are set from the shift amount control circuit 105. A value obtained by the shift computation (irradiation amount data) is converted to a blanking-off time signal by an irradiation amount control circuit 106, and the signal is supplied to each blanking electrode in a blanking array 107.

The bit map shift computation and the irradiation amount control are performed in parallel by an amount corresponding to the number of beams in the sub field synchronously with a sync signal from a deflection signal generating circuit 108. The sync signal is also input to a deflection control circuit 109, and is also synchronized with an output of the deflection control circuit 109 and a deflection signal supplied to a deflector 110. The pattern data shifted is written in the area including the deflection area margin by a single deflector 110.

Parameters such as the shift amount are stored in the CPU 101 while detecting the positions of beams by using a Faraday cup 112 on a specimen stage 111. The position of each beam is detected on the basis of positional information from a stage control circuit 113 and a beam profile signal from a signal processing circuit 114.

Figure 5:
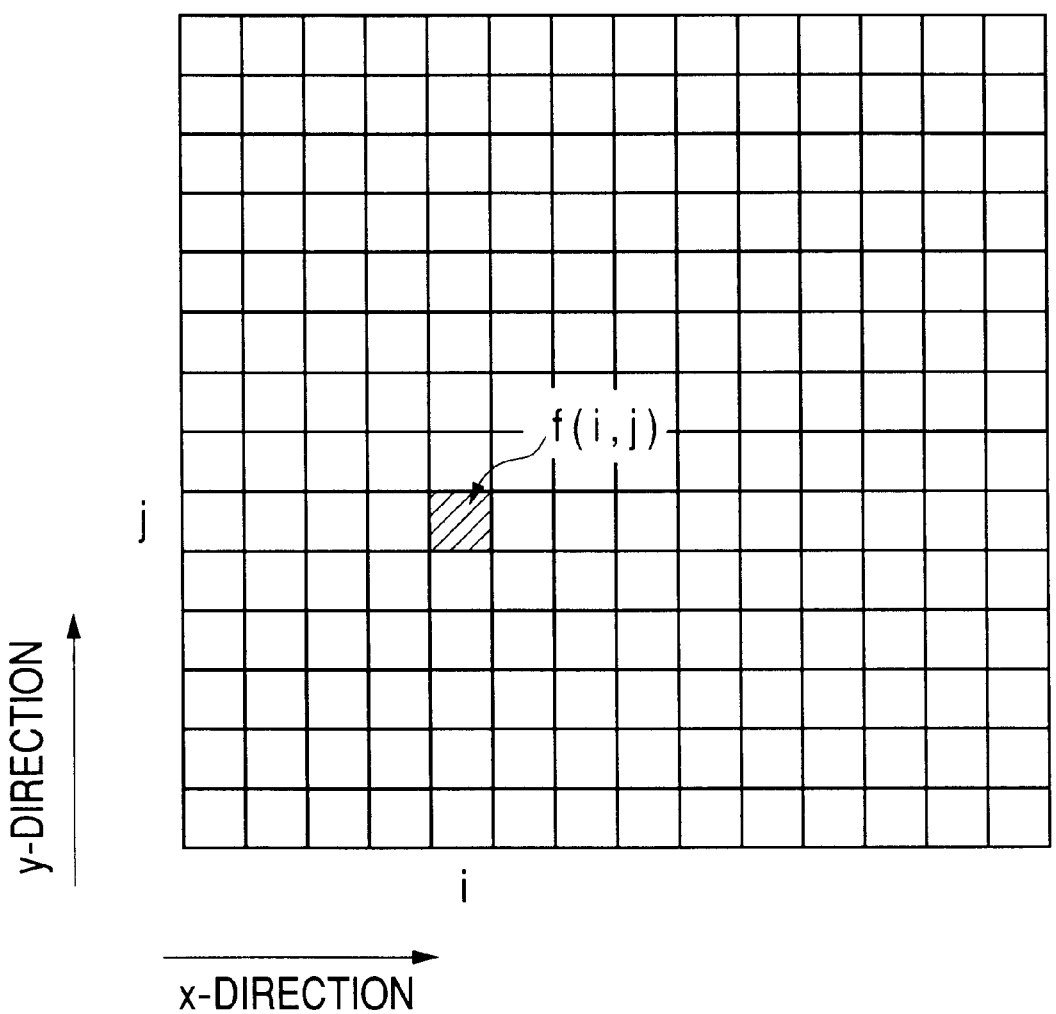
FIG. 5 is a diagram showing a bit map memory of a micro field.

A method of the bit map shift computation will now be described. FIG. 5 shows a bit map memory in a micro field. The i-th data in the x-direction and the j-th data in the y-direction stored in the memory is referred to as f(i, j).

First, a method of performing a shift smaller than a pixel will be described. The shift smaller than a pixel is performed by using linear interpolation computation. The linear interpolation is expressed by the following equation. The shift in the x-direction is as follows.

$$f(i,j)=(1-dx)f(i,j)+dxf(i-1,j) \quad \text{(Equation 1)}$$

where f(i, j) denotes an irradiation amount at a pixel position (i, j) and each of dx and dy denotes a shift amount when the pixel size is normalized to 1. The shift in the y-direction is similarly as follows.

$$f(i,j)=(1-dy)f(i,j)+dyf(i,j-1) \quad \text{(Equation 2)}$$

Shifts in both of the x and y directions are computed by computing the shift in each of the x- and y-directions. The shifts can be computed at once by combining the above equations as follows.

$$f(i,j)=(1-dx)(1-dy)f(i,j)+dx(1-dy)f(i-1,j)+ \\ (1-dx)dyf(i,j-1)+dxdyf(i-1,j-1) \quad \text{(Equation 3)}$$

The above computation is carried out by reading of data from the bit map memory, addition, and multiplication. As means for realizing the computation, generally, a computing circuit such as a general microprocessor having a calculation program is used. To execute high-speed computation of, for example, 100 MHz or higher, a dedicated circuit has to be constructed. To construct the dedicate circuit, the Equation 1 is expressed differently as follows.

$$f(i,j)=f(i,j)+dx(f(i-1,j)-f(i,j)) \quad \text{(Equation 4)}$$

Figure 12:
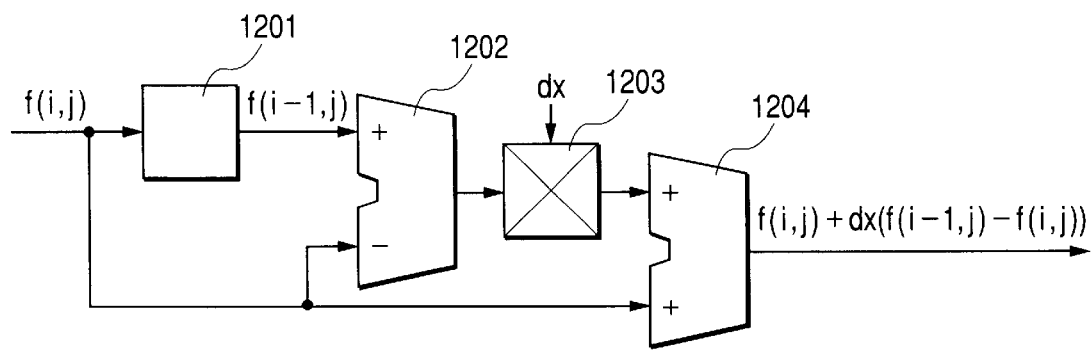
FIG. 12 is a diagram showing an example of the circuit configuration of a fourth embodiment of the invention.

This expression is convenient to construct the dedicated circuit since multiplication is executed only once. FIG. 12 shows an example of the circuit configuration. f(i,j) read from the bit map memory is supplied to a shift register 1201 and also subjected to sign change and supplied to an adder 1202. The shift register holds the immediately preceding data. It is assumed here that beam deflection in the micro field corresponds to the increase direction of x, that is, increment of "i". The output of the shift register 1201 is also input to the adder 1201 and, f(i−1,j)−f(i,j) is output as a result. The output is multiplied by dx by a multiplexer 1203. This output of the result and f(i,j) read from the bit map memory are input to an adder 1204 and, as a result, Equation 4 is derived. In the y-direction, it is sufficient to connect the same circuit at the post stage of the circuit shown in FIG. 12. The configuration in the y direction is similar to that in the x-direction except for the point that the shift register 1201 holds data of an immediately preceding line.

By arranging a plurality of such circuits and performing a so-called pipeline process, high speed processing can be performed.

Figure 6A:
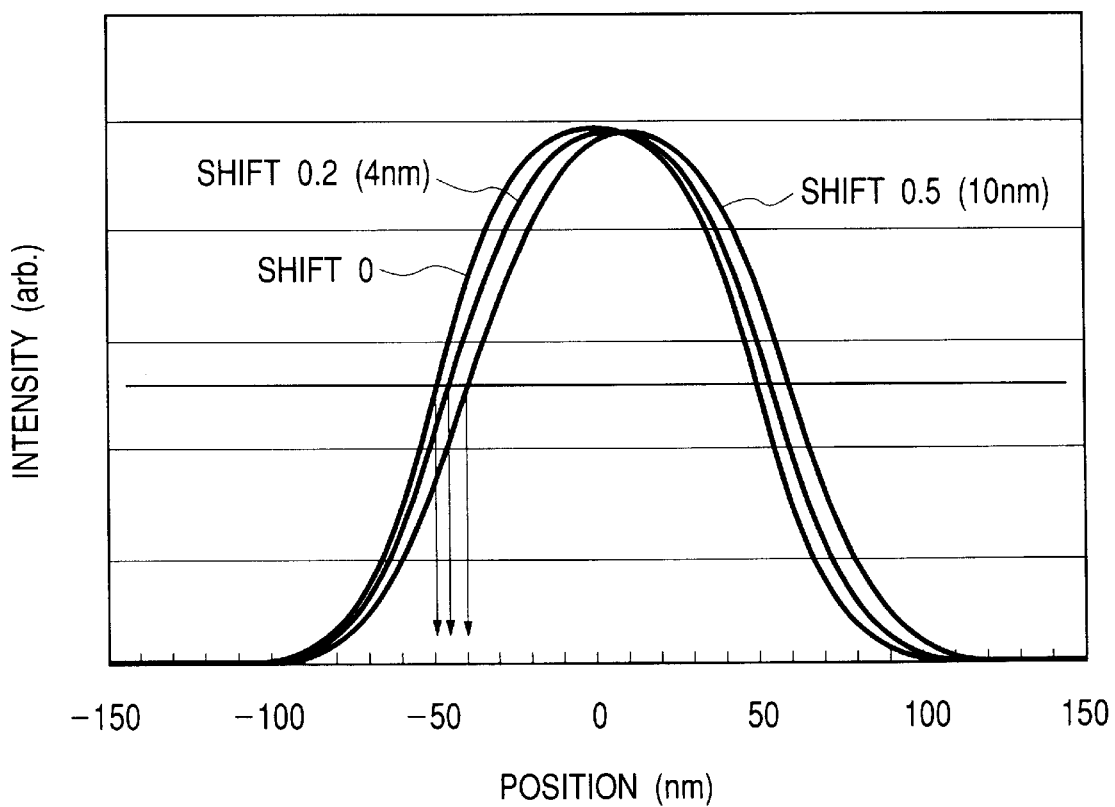
FIGS. 6(A) to 6(D) are diagrams showing a beam profile indicative of a result of data shifting.
Figure 6B:
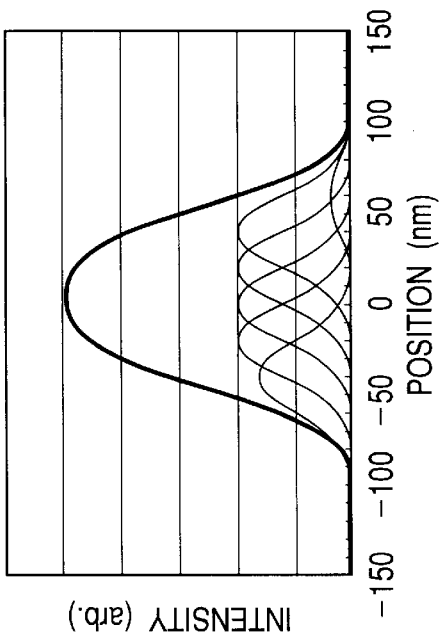
Figure 6C:
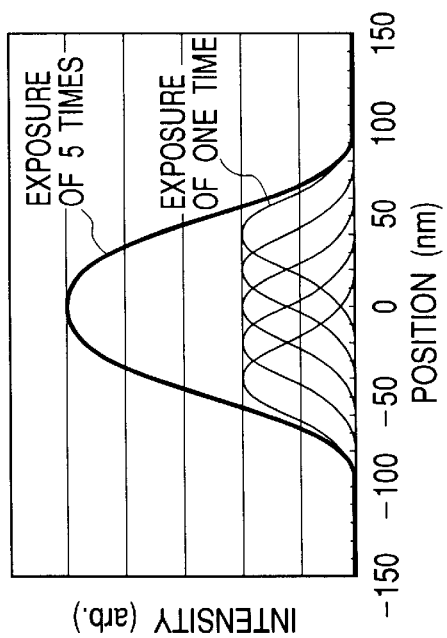
Figure 6D:
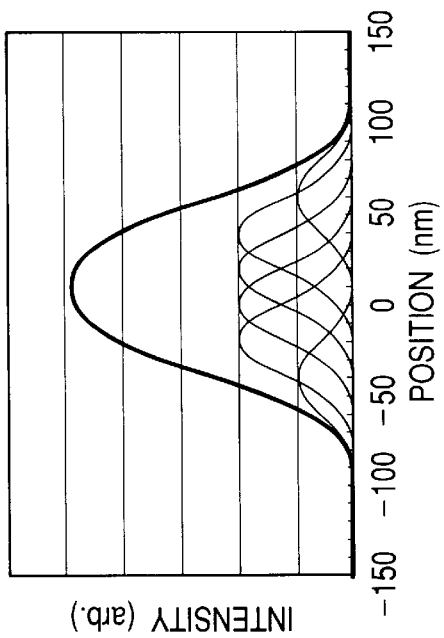

FIGS. 6(A) to 6(D) show beam profiles as the result of shifting of the data. FIG. 6(B) shows an example of forming a pattern of 100 nm by irradiating five pixels of 20 nm with a beam having a beam blur of 20 nm. Although FIGS. 6(A) to 6(D) show only one-dimensional direction for simplicity of explanation, the case of two-dimensional direction is substantially the same. FIG. 6(C) shows a case where the profile of FIG. 6(B) is shifted in the positive direction (to the right in the diagram) by 4 nm (dx=0.2). The beam irradiation amount at the left end becomes 80% of the original irradiation amount, and the sixth pixel from the right end is irradiated with a 20% irradiation amount. As a result, the pattern of 100 nm is shifted by 4 nm. Similarly, FIG. 6(D) shows an example where the profile of FIG. 6(B) is shifted by 10 nm (dx=0.5). The beam irradiation amount at both ends becomes 50%. FIG. 6(A) shows those shifts of the pattern of 100 nm. By performing the linear interpolation computation as described above, a shift smaller than a pixel can be made.

A method of making a shift equal to or larger than a pixel will now be described. The shift equal to or larger than a pixel is realized by changing the reading position in a bit map memory. It is sufficient to add an offset to each of "i" and "j" in f(i,j).

$$f(i,j)=f(i+i_{offset}, j+j_{offset}) \quad \text{(Equation 5)}$$

where f' denotes an irradiation amount in an exposed pixel position, $i_{offset}$ denotes a reading position offset in the x-direction, and $j_{offset}$ denotes a reading position offset in the y-direction.

Therefore, a reading position offset in the case where a shift amount is given and a shift amount smaller than a pixel have the following relation.

reading position offset=integer part (shift amount/pixel size)

shift smaller than pixel=remainder part (shift amount/pixel size)

For example, when the size of one pixel is 20 nm and the shift amount is 50 nm, the reading position offset is 2 and the shift amount smaller than a pixel is 10 nm. The pixel shift amount when the pixel size is normalized to 1 is 0.5.

By combining the reading position offset and the shift amount smaller than the pixel, the direction of a shift can be changed. In the methods of Equations 1 and 2, the pattern can be shifted only in the positive direction (the direction in which coordinates increase) in each of the x- and y-directions. In order to make a shift in the negative direction, it is sufficient to shift the pattern in,the negative direction more than a necessary shift amount on the pixel unit basis in an offset and shift the pattern to the positive side by the difference from the necessary shift amount. The relation between the reading position offset and the shift amount smaller than a pixel is as follows.

reading position offset=integer part (negative shift amount/pixel size)−1 shift amount smaller than pixel=remainder part (shift amount/pixel size)+pixel size For example, when the size of one pixel is 20 nm and the shift amount is 35 nm in the negative direction, the reading position offset is −2 and the shift amount smaller than the pixel is 5 nm.

Embodiment 2

Figure 7:
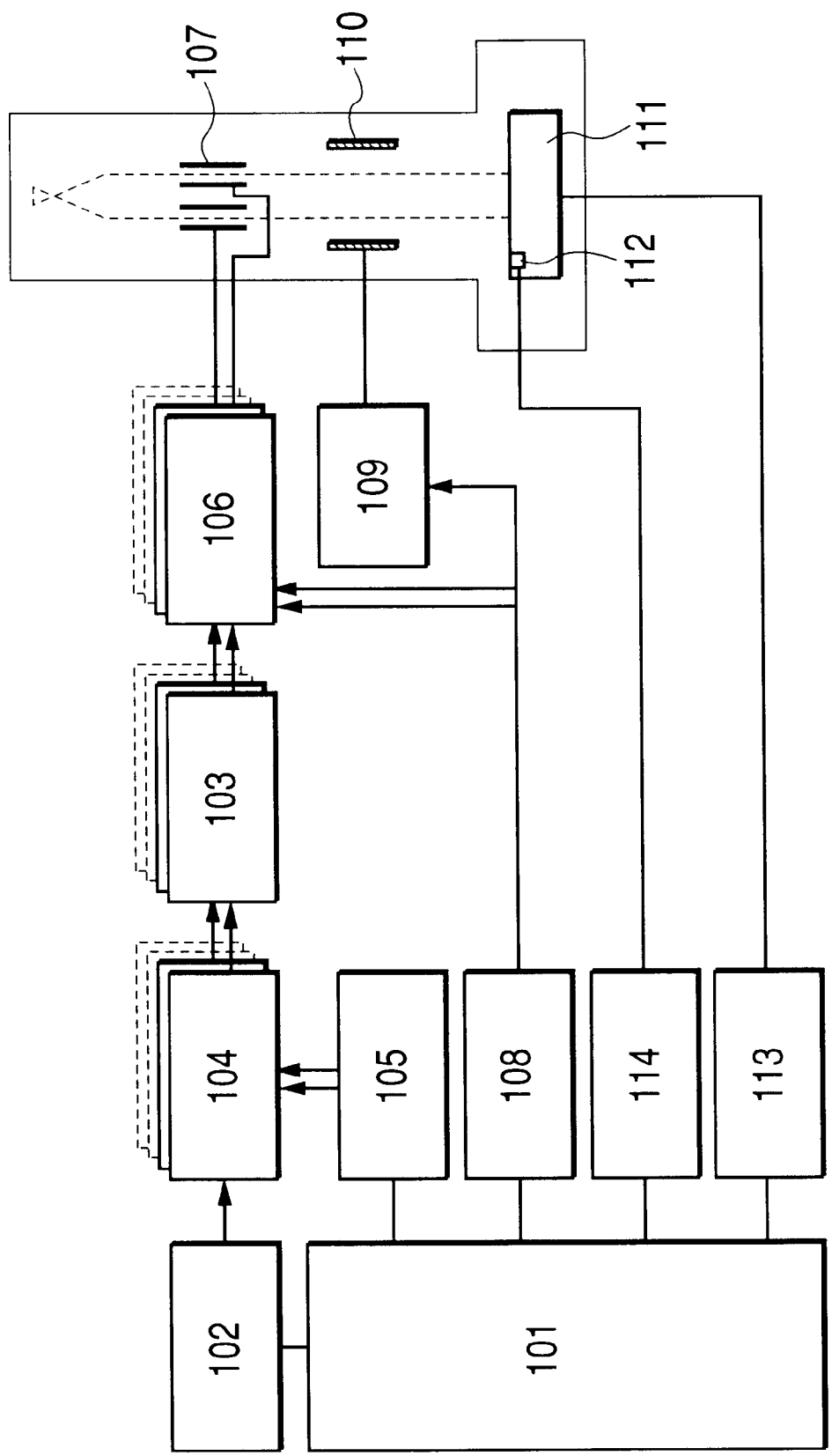
FIG. 7 is a diagram for explaining a second embodiment of the invention.

In the embodiment 1, the bit map shifting is performed synchronously with reading of a bit map memory, that is, exposing operation. However, in the case where the beam position shifts only fixedly, there is a method of shifting a bit map before pattern data developed to a bit map is stored into a bit map memory. FIG. 7 shows an exposure control. Since FIG. 7 is similar to FIG. 1, the same reference numerals are used for explanation.

Figure 1:
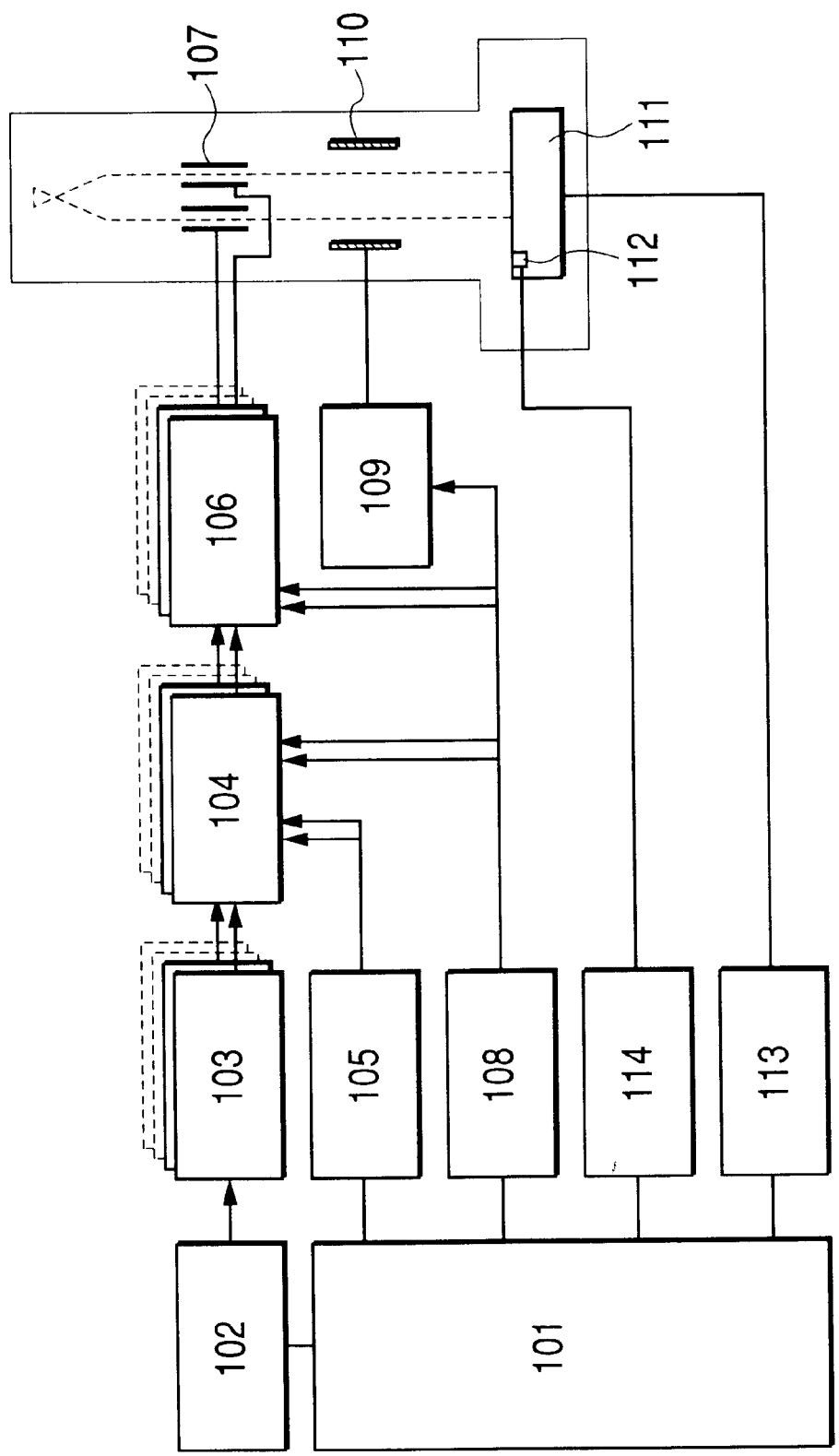
FIG. 1 is a diagram for explaining a first embodiment of the invention.

In the embodiment 2, the order of the bit map memory 103 and the bit map shifting circuit 104 constructing the shift amount computing circuit is different from that of FIG. 1. Exposure pattern data stored in the CPU 101 is developed to bit map data in a pixel unit by the bit map developing circuit 102. The developed data is divided on a micro field unit basis. The divided data is shifted by the bit map shifting circuit 104 every micro field. The resultant data is stored as irradiation amount data in the bit map memory 103 constructed by the number of micro fields.

Parameters such as a shift amount are set from the shift amount control circuit 105. Since the bit map memory 103 is obtained by adding the deflection area margin in a manner similar to FIG. 1, shifted data can be stored.

The bit map memory 103 is read by the irradiation amount control circuit 106 synchronously with deflection and converted into a blanking-off time signal. The blanking-off time signal is supplied to each of the blanking electrodes of the blanking array 107. The other configuration is similar to that of FIG. 1.

Embodiment 3

Figure 3:
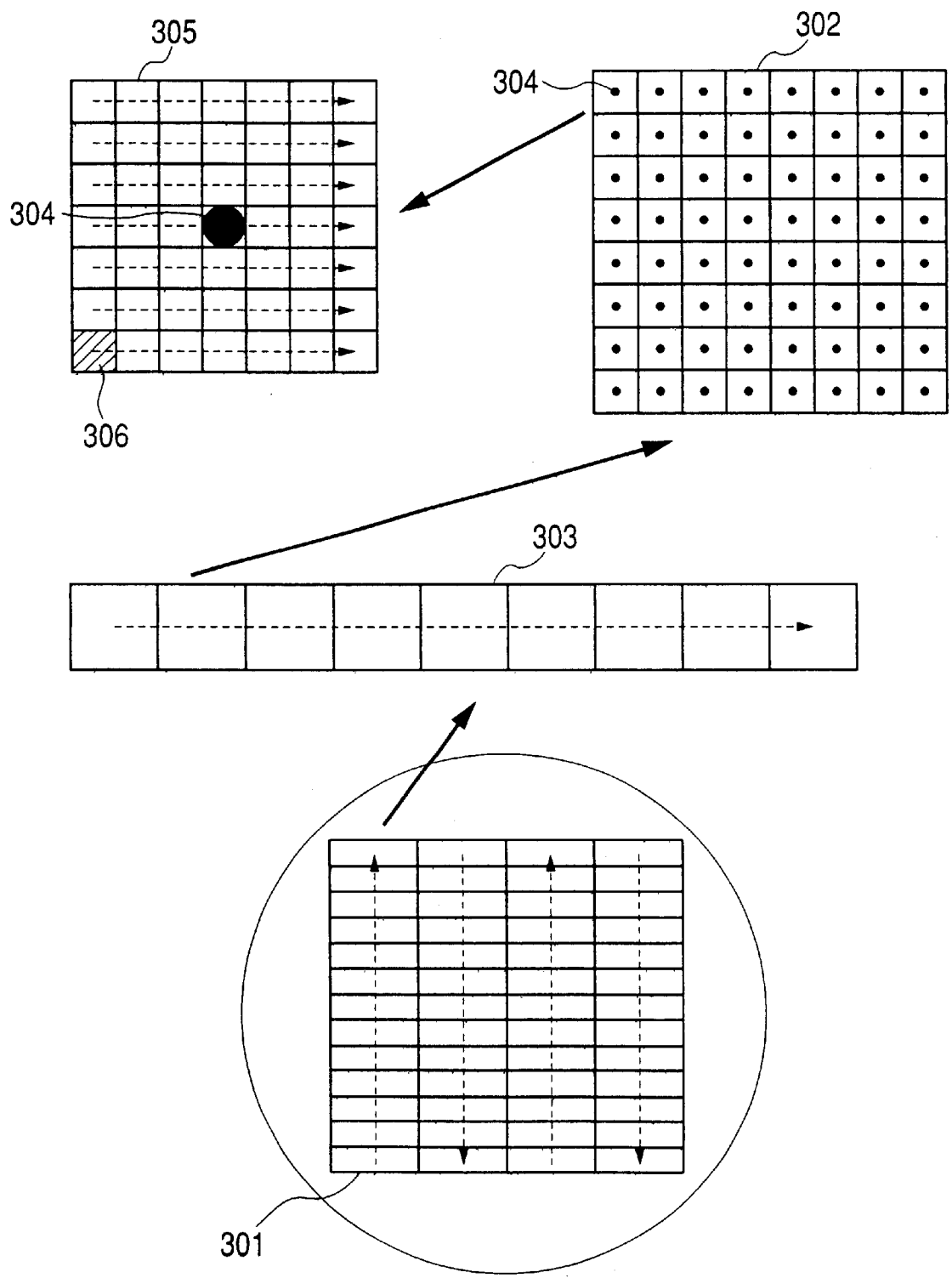
FIG. 3 is a diagram showing an exposing operation in the exposure apparatus of the embodiment.

According to the exposure method of the invention, a specimen is irradiated with electron beams on the unit basis of the sub field shown in FIG. 3. It is equivalent to that the sub field is regarded as a single plane-shaped beam. The sub field is deflected by the main deflector and exposure is performed. The larger the area of the sub field is, the faster the exposure speed is. On the other hand, an aberration becomes larger. In the example, the sub field is of a 256 μm square, so that a deflection aberration cannot be ignored. It is ideal to reduce the aberration as much as possible by using the dynamic focal point and astigmatism correctors shown in FIG. 2. However, there are many kinds of aberrations which are caused by deflection, such as focal point deviation, astigmatism, distortion, magnification error, and rotation error. In the case of simultaneously correcting all of the aberrations, the number of focal point correctors and astigmatism correctors more than the number of aberrations to be corrected have to be disposed, and dynamic control is necessary, so that it is difficult to realize correction of all the aberrations.

Figure 8:
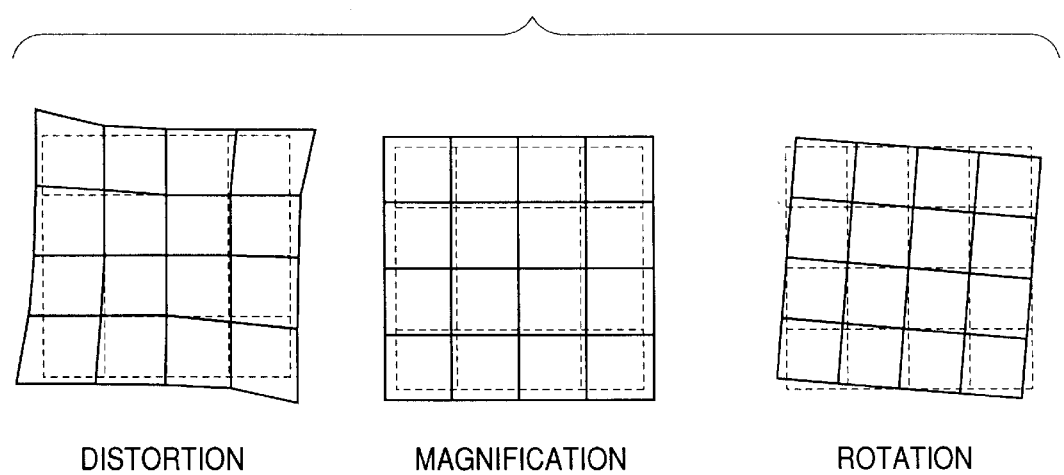
FIG. 8 is a diagram showing a distortion, a magnification error, and a rotation error.

FIG. 8 shows the distortion, magnification error, and rotation error among the aberrations. Broken lines in the diagram show ideal lattices, and solid lines indicate deviations from the ideal lattices. The aberrations correspond to shifts of each beam position. By shifting the exposure position, the aberrations can be corrected.

However, since the aberrations are caused by deflection, a shift amount has to be computed every deflecting operation. Further, an aberration caused by deflection has dependency on position in the plane-shaped beam (sub field) depending on the main deflection amount. Further, the shape of the micro field also has dependency on the main deflection amount and position in the sub field depending on the main deflection amount. The position dependency can be approximated by a cubic polynomial of a deflection distance in theory. Therefore, a correction amount in a micro field can be calculated by the following equations.

$$\begin{aligned} dx &= a_{00} + a_{01}x_\mu + a_{11}y_\mu + a_{02}x_\mu^2 + a_{12}x_\mu y_\mu + \\ & \quad a_{22}y_\mu^2 + a_{03}x_\mu^3 + a_{13}x_\mu^2 y_\mu + a_{23}x_\mu y_\mu^2 + a_{33}y_\mu^3 \\ &= \sum_{i=0}^{3} \sum_{j=0}^{i} a_{ji} x_\mu^{i-j} y_\mu^j \\ dy &= b_{00} + b_{01}x_\mu + b_{11}y_\mu + b_{02}x_\mu^2 + b_{12}x_\mu y_\mu + \\ & \quad b_{22}y_\mu^2 + b_{03}x_\mu^3 + b_{13}x_\mu^2 y_\mu + b_{23}x_\mu y_\mu^2 + b_{33}y_\mu^3 \\ &= \sum_{i=0}^{3} \sum_{j=0}^{i} b_{ji} x_\mu^{i-j} y_\mu^j \end{aligned} \quad \text{(Equation 6)}$$

where dx and dy denote correction amounts depending on positions $x_\mu$ and $y_\mu$ in the micro field. Ten coefficients from $a_{00}$ to $a_{33}$ and ten coefficients from $b_{00}$ to $b_{33}$ depend on main deflection amounts $x_m$ and $y_m$ and positions $x_s$ and $y_s$ in a sub field. For example, when $a_{00}$ depends on the position $x_s$, $y_s$ in the sub field and the coefficients in this case are $c_{00}$ to $c_{33}$, it is expressed as the following Equation 7 in a manner similar to Equation 6.

$$a_{00} = \sum_{i=0}^{3} \sum_{j=0}^{i} c_{ji} x_s^{i-j} y_s^j \qquad \text{(Equation 7)}$$

Further, the coefficient "c" depends on the main deflection amounts $x_m$ and $y_m$ and the coefficient in this case is "d", for example, $c_{00}$ is expressed as the following Equation 8.

$$a_{00} = \sum_{i=0}^{3} \sum_{j=0}^{i} d_{ji} x_m^{i-j} y_m^j \qquad \text{(Equation 8)}$$

The coefficients other than the coefficients $a_{00}$ and $c_{00}$ are similar to those in Equation 6. The coefficient "b" can be also similarly obtained. Therefore, dx and dy in Equation 3 are values depending on the deflection position and are expressed as dx(i,j) and dy (i,j), respectively.

When a shift or rotation of a whole sub field (all of the micro fields) generated by the main deflection amount is corrected by the main deflection, the shift and rotation amount of each micro field expressed by Equation 6 becomes minimum and the exposure speed increases.

The position dependency of the shift amount, that is, the coefficients of "a" and "b" in Equation 6 can be obtained by determining a few to tens of representative positions and measuring a beam position with respect to all of the deflection amounts as described above, or by performing a trial exposure, measuring a shift amount from a design position, and executing least square approximation or the like.

Figure 9:
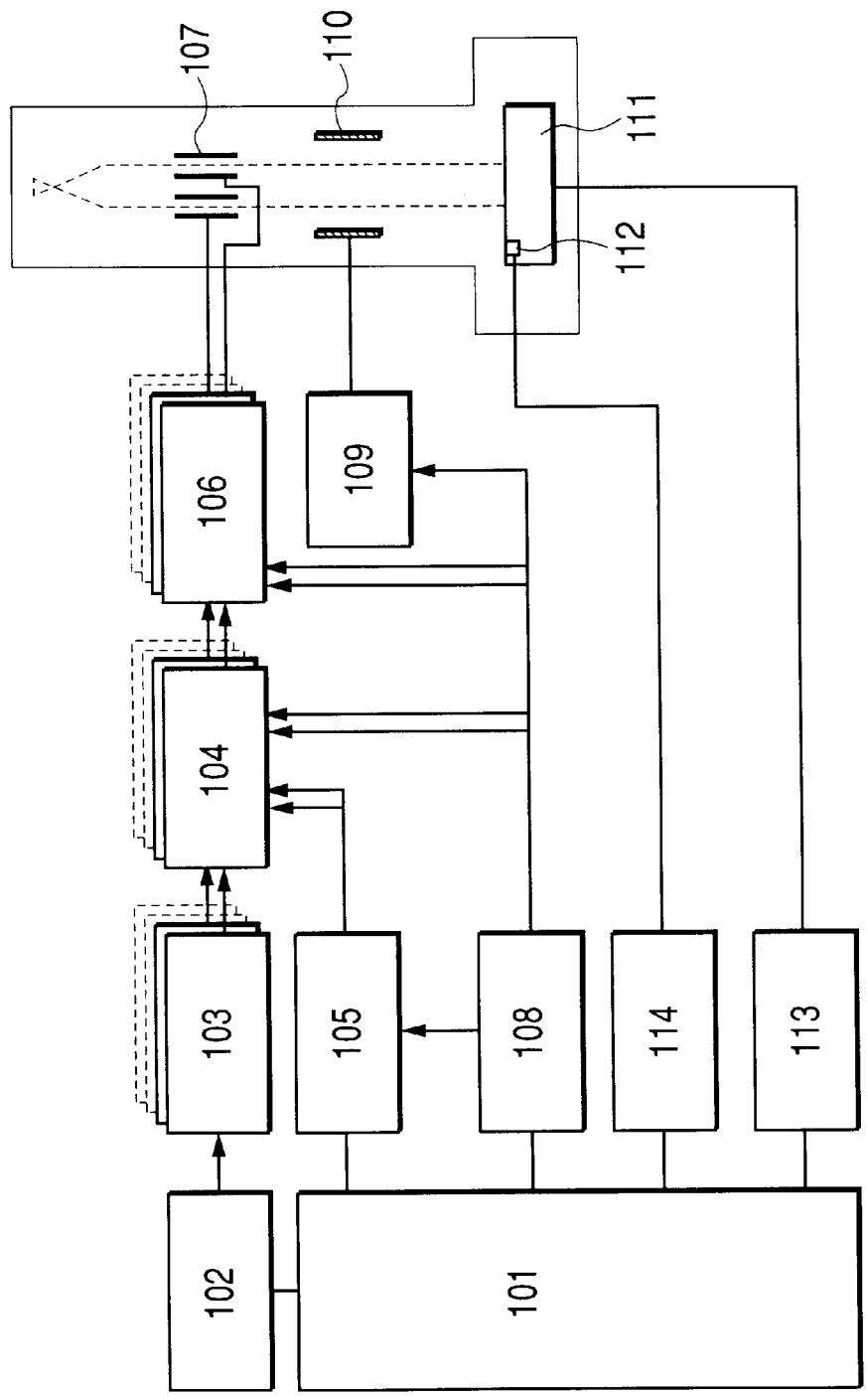
FIG. 9 is a diagram for explaining a third embodiment of the invention.

FIG. 9 shows the configuration of exposure control. Since the configuration is similar to that of FIG. 1, it will be described by using the same reference numerals. Shifting of pattern data depends on deflection coordinates, so that computation of Equation 6 has to be performed synchronously with deflection. Therefore, synchronously with a sync signal from a deflection signal generating circuit 908, a main deflection amount and a shift amount depending on a position in a sub field are computed by a shift amount control circuit 905 as a component of the shift amount computing circuit. Further, a shift amount of pattern data is actually computed by a bit map shift circuit 904. The subsequent operations are the same as those in the example shown in FIG. 1.

The magnification error and rotation error occur also in the case where the height of the specimen fluctuates. However, fluctuations in the height of the specimen occur when the specimen stage is moved. Since the frequency of occurrence is lower than the deflecting operation, the fluctuations can be computed so as to be included in Equation 6. In this case, it is sufficient to preliminarily compute a magnification fluctuation amount and the rotation fluctuation amount with respect to the fluctuation in the height of a specimen and multiply the magnification fluctuation amount and the rotation fluctuation amount by a coefficient of the term of the first degree of the deflection amount in Equation 6.

In the dynamic focal point correction, even if the specimen height fluctuates, changes in magnification and rotation can be eliminated. When the specimen stage is provided with a height correcting function and a rotation correcting function, errors of magnification and rotation do not occur. Also in the case of mounting a specimen stage with a function of correcting dynamic focal point, height fluctuation, and rotation, it cannot be avoided that the system and control become complicated. The method of the invention is effective since the magnification and rotation error can be corrected with a simple configuration.

Fourth Embodiment

In the third embodiment, Equation 6 relates computation of the third order. However, in the case where an aberration which is caused by deflection is small, correction may be simplified only by performing computation of the term of the 0th degree (only an offset amount), the term of the first degree, or the term of the second degree. When the circuit as shown in FIG. 12 is used for the computation of Equation 6, the lower the degree becomes, the smaller the number of computation times becomes. Thus, the circuit can be simplified.

Depending on design and configuration of an electron optical system and the size of a main, sub, or micro field, an aberration can be reduced to a degree that it can be ignored in comparison with required precision. There is consequently a case that dependency on the deflection amount of correction computation can be decreased, and a simplified deflection amount can be used. For example, there are a case that $X_\mu$ and $Y_\mu$ shown in the third embodiment are set to only rotation and magnification (they are used only for the term of the first degree), and a case where dependency of $X_\mu$ and $Y_\mu$ is not considered. The deflection amount dependency of coefficients of "a" and "b" in Equation 6 may be expressed as $X_m+X_s+X_\mu$ and $Y_m+Y_s+Y_\mu$, or $X_m+X_s$ and $Y_m+Y_s$.

For example, if a focal point corrector and an astigmatism corrector are properly used, a distortion of a sub field of a 256 $\mu$m square can be reduced to about 100 nm at an end portion of a main field of 4 mm. At this time, deformation of a micro field of a 4 $\mu$m square becomes about 1 nm at the maximum and can be ignored. That is, it becomes unnecessary to compute dependency of $X_\mu$ and $Y_\mu$.

However, a deviation occurs in relative positional relation between a micro field in the center of a sub field and a micro field in an end portion of the sub field and, as a result, a deviation occurs in connection with neighboring sub fields. In this case, only the main deflection amount and the shift terms ($a_{00}$ and $b_{00}$ in Equation 6) depending on the main deflection amount and the position in the sub field are computed in each micro field. Based on the computation, exposure is performed while shifting the center position of each micro field. As a result, a connection error of micro fields can be decreased to an ignorable degree.

Figure 15:
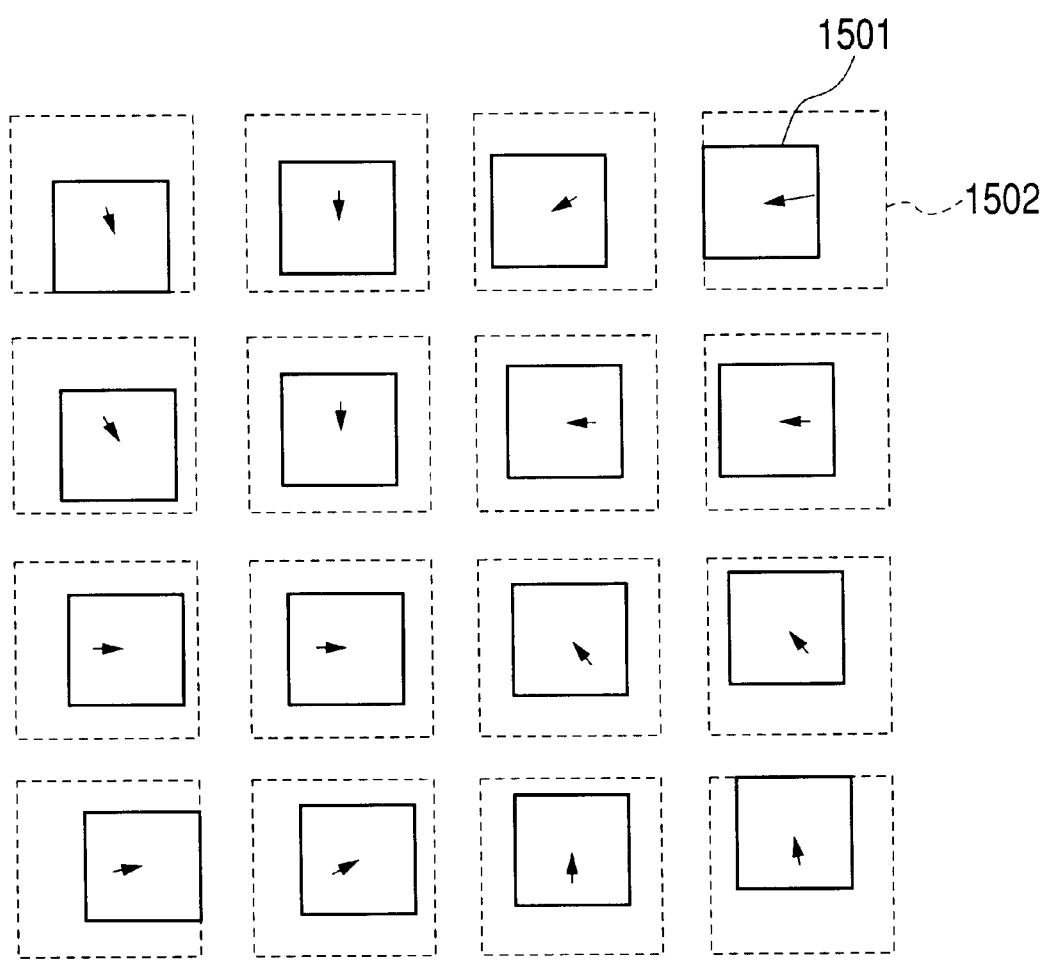
FIG. 15 is a diagram showing a state of a pattern shift at the time of correcting a distortion in the fourth embodiment of the invention.

FIG. 15 shows a pattern shift of a micro field of 4×4 and illustrates a micro field size 1501 and a deflection area margin 1502 in pattern data. Each of the arrows in the diagram denotes a shift direction of the center position.

Fifth Embodiment

It is possible to regard a plurality of beams in a sub field as independent ones and compute main deflection dependency of each of the plurality of beams without considering dependency of $X_s$ and $Y_s$. In this case, the correction amount of each beam is expressed as follows in a manner similar to Equation 6.

$$dx_n = \sum_{i=0}^{3} \sum_{j=0}^{i} a_{nji} x_\mu^{i-j} y_\mu^j \qquad \text{(Equation 9)}$$

$$dy_n = \sum_{i=0}^{3} \sum_{j=0}^{i} b_{nji} x_\mu^{i-j} y_\mu^j$$

where n denotes the number-assigned to each beam (in the case of 1000 beams, the numbers are from 1 to 1000). Since dependency on position in a sub field is not considered, a coefficient "a" depends on only the main deflection amounts $x_m$ and $y_m$.

$$a_{n00} = \sum_{i=0}^{3} \sum_{j=0}^{i} d_{nji} x_m^{i-j} y_m^j \quad \text{(Equation 10)}$$

where n corresponds to n in Equation 9. A coefficient is computed by a method of measuring dependency on the main deflection amount of each of all the beams. Specifically, the beams are deflected in some positions at a proper interval (for example, the size of a sub field), and the position of each beam in the position is obtained by mark detection or the like. The positions are approximated by a polynomial (Equation 10), the value of the coefficient "a" of each beam can be computed. The coefficient "b" can be also similarly calculated.

By calculating the main deflection amount dependency of the beams at representative points (for example, in the peripheral and center parts in a sub field) and interpolating the other coefficients from the coefficients in the representative points by using a polynomial or the like, all of coefficients "a" and "b" can be determined by detecting the small number of beam positions.

For example, when a strain in a sub field of 256 $\mu$m×256 $\mu$m is about 100 nm in an end portion of a main field of 4 mm and deformation of a micro field of a 4 $\mu$m square is about 1 nm at the maximum, it is unnecessary to compute dependency of $X^\mu$ and $Y_\mu$. To obtain a deviation in a relative position relation between a micro field in the center of a sub field and a micro field in an end portion of a sub field, it is sufficient to compute only a shift term ($a_{00}$ and $b_{00}$ in Equation 9) depending on the main deflection amount of all of the beams. Only by performing exposure while shifting the center position of each micro field on the basis of the computation, the connection error of micro fields is reduced to an ignorable degree.

Sixth Embodiment

A positional shift of a beam caused by deflection described in the third embodiment usually depends on the deflection amount and increases. That is, a shift amount in the deflection position 0 (on the optical axis) and that in the maximum deflection position are different from each other.

Figure 13A:
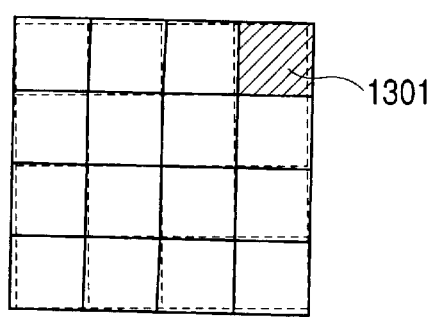
FIGS. 13(A) to 13(D) are diagrams showing the relation between a distorted shape depended on a deflection position and a deflection area margin in a sixth embodiment of the invention.
Figure 13B:
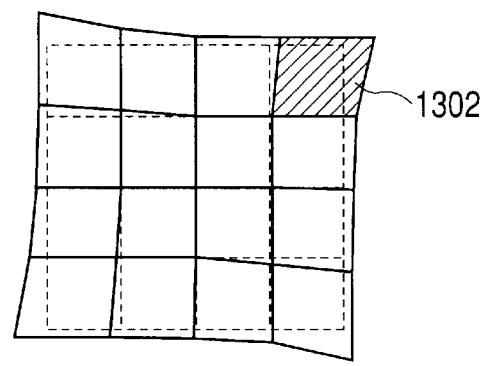
Figure 13C:
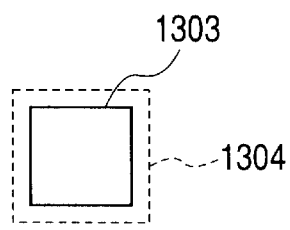
Figure 13D:
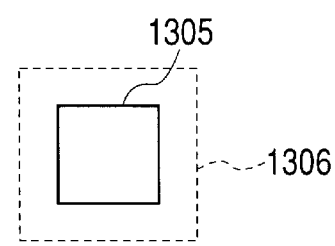

An example of a distortion will be described by referring to FIGS. 13(A) to 13(D). FIG. 13(A) shows the shape of a distortion on the center axis. FIG. 13(B) shows the shape of the distortion in a maximum deflection position. When it is assumed that each of FIGS. 13(A) to 13(D) shows a micro field of 4×4, the hatched area in FIG. 13(B) indicates the most distorted micro field. A micro field 1302 in the maximum deflection position is deformed more than a micro field 1301 in the deflection position 0 and has a larger data shift amount, so that a larger deflection area margin is necessary. FIG. 13(C) shows the relation between a micro field size 1303 in the deflection position 0 and a deflection area margin 1304, and FIG. 13(D) shows the relation between a micro field size 1305 in the maximum deflection position and a deflection area margin 1306. For example, under the condition that one pixel is 20 nm, when a distortion amount in the deflection position 0 is 10 nm at the maximum and the distortion amount in the maximum deflection position is 50 nm, the deflection area margins are one pixel and three pixels, respectively. It is sufficient to set a change in the deflection margin area by setting a set value of a counter for reading a bit map memory so as to depend on the deflection amount.

The deflection area margin is an area where a beam is actually deflected. If the deflection area margin is small, there is no deflection of an excessive area. Thus, exposure speed is improved.

Seventh Embodiment

A positional shift of a beam caused by deflection shown in the third embodiment depends on the deflecting operation and is always constant. On the other hand, in many cases, a change with time in the position of the electron beam, that is, a so-called beam drift cannot be predicted. Particularly, when the direction and size of the drift differ among a plurality of beams, a case such that the deflection area margin is not efficient can be also presumed. In such a case, a deflector array for beam position adjustment may be provided for each of a plurality of beams.

Figure 14:
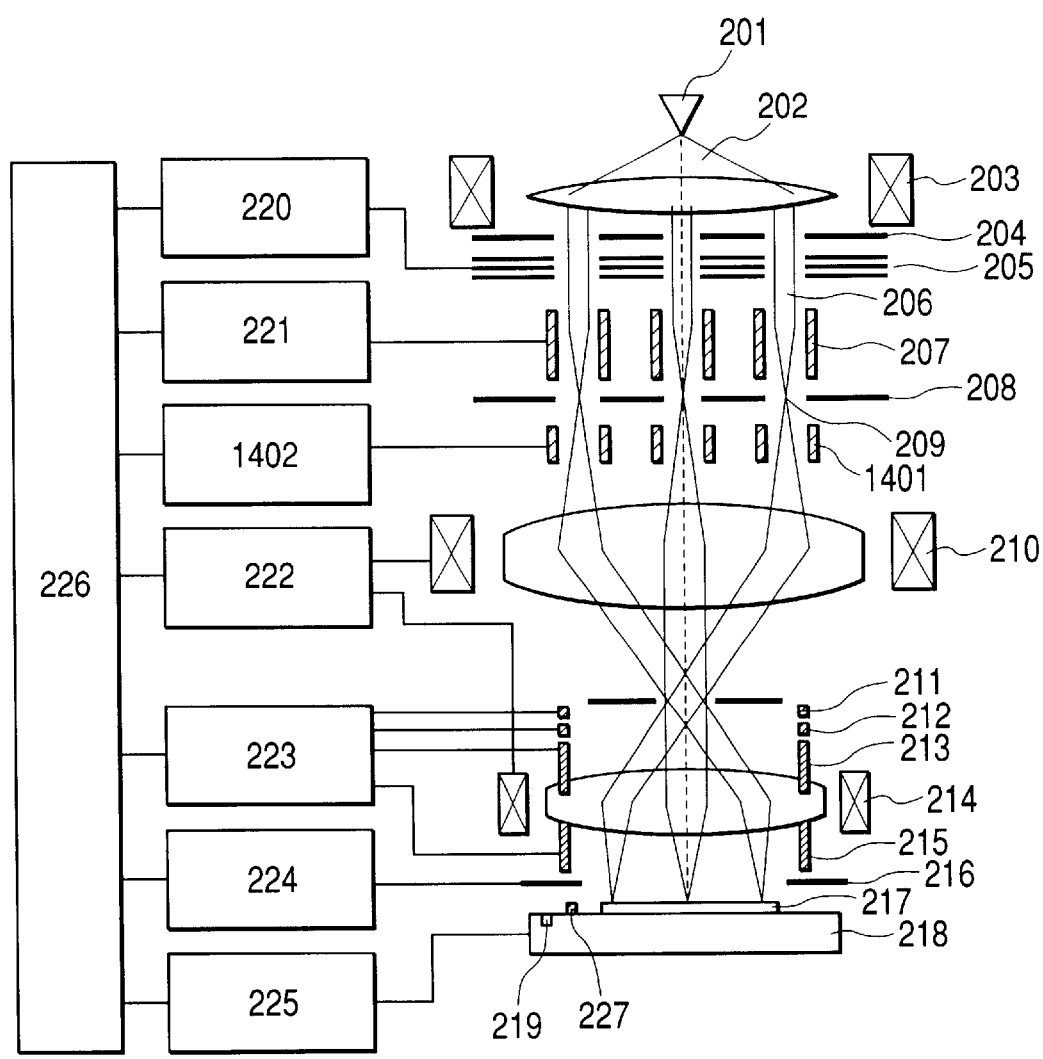
FIG. 14 is a diagram for explaining a seventh embodiment of the invention.

FIG. 14 shows an example where the electron beam exposure apparatus of FIG. 2 is provided with a deflector array for beam position adjustment. Since FIG. 14 is similar to FIG. 2 and the same reference numerals are used, only different points will be described. A deflector array 1401 is provided below the blanking aperture 208. Even when the deflector array 1401 is mounted above the blanking aperture 208, an equivalent function can be obtained. By the deflector array 1401, a beam interval on a specimen can be corrected. The correction is made by measuring each beam position as described in the first embodiment, and applying a voltage by an optical axis controller 1402 so as to set the predetermined interval. Since the optical axis which is set once is maintained constant until the next measurement, a high-speed circuit is not necessary for the optical axis controller 1402. In such a state, correction by data shifting depending on the deflection described in the third embodiment is made, thereby enabling the beam positional shift due to a manufacturing error to be eliminated. Thus, the deflection area margin can be efficiently used.

Eighth Embodiment

FIGS. 10(A) to 10(D) show a process of fabricating a semiconductor integrated circuit by using an electron beam exposure method of the invention.

FIGS. 10(A) to 10(D) are cross sections of a device fabricated in the process. In/on an N⁻ silicon substrate 1020, a p-well layer 1021, a p-layer 1022, a field oxide film 1023, a polysilicon/silicon oxide film gate 1024, a p high-density diffusion layer 1025, an N high-density diffusion layer 1026, and the like are formed by a normal method (FIG. 10(A)). After that, an insulating film 1027 made of phosphorus glass is deposited and undergoes dry etching, thereby forming a contact hole 1028 (FIG. 10(B)).

Figure 10A:
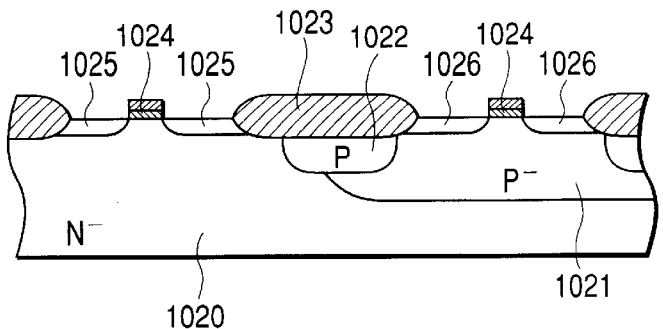
FIGS. 10(A) to 10(D) are diagrams showing an example of a process of fabricating a semiconductor integrated circuit, according to an electron beam exposure method of the invention.
Figure 10B:
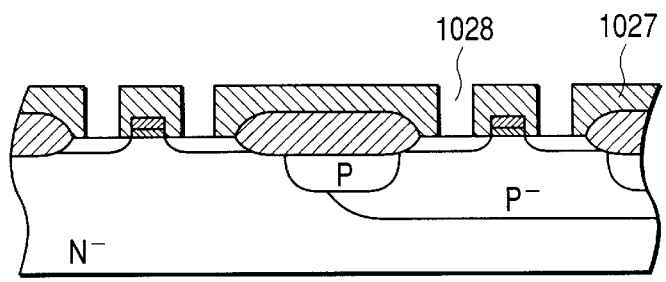
Figure 10C:
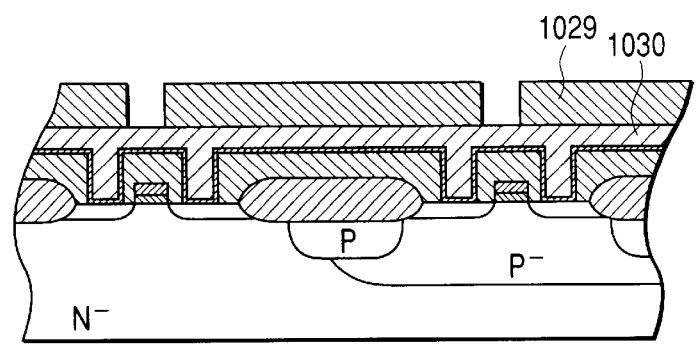
Figure 10D:
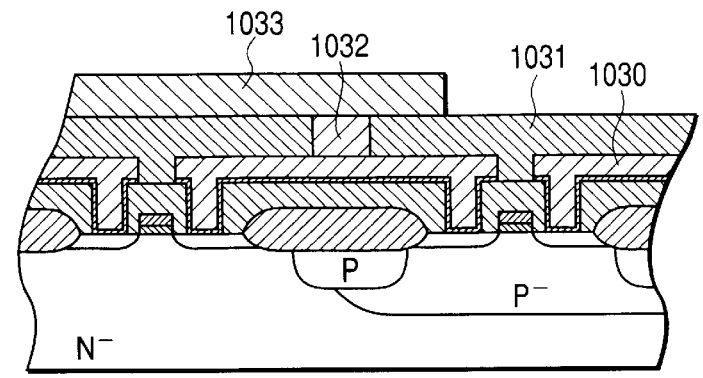

Subsequently, a W/TiN electrode wiring 1030 material is coated by a normal method and a photosensitive agent 1029 is applied on the W/TiN electrode wiring 1030 material and patterned by using the electron beam exposure method of the invention (FIG. 10(C)). By dry etching or the like, the W/TiN electrode wiring 1030 is formed.

After that, an interlayer insulating film 1031 is formed and a hole pattern 1032 is formed by a normal method. The hole pattern 1032 is buried with an W plug, and a second wiring 1033 made of Al is connected (FIG. 10(D)). The following passivation process used is a conventional one.

Although only main fabricating processes have been described in the embodiment, except for using the electron beam exposure method in the lithography process for forming the W/TiN electrode wiring, the same processes as those in the conventional technique are used. By the processes, a pattern can be formed without deteriorating the quality, and a CMOS LSI can be fabricated at high yield. By fabricating a semiconductor integrated circuit by using the electron beam exposure method of the invention, exposure precision is improved, so that the yield is improved and the amount of production is increased.

Ninth Embodiment

Figure 16:
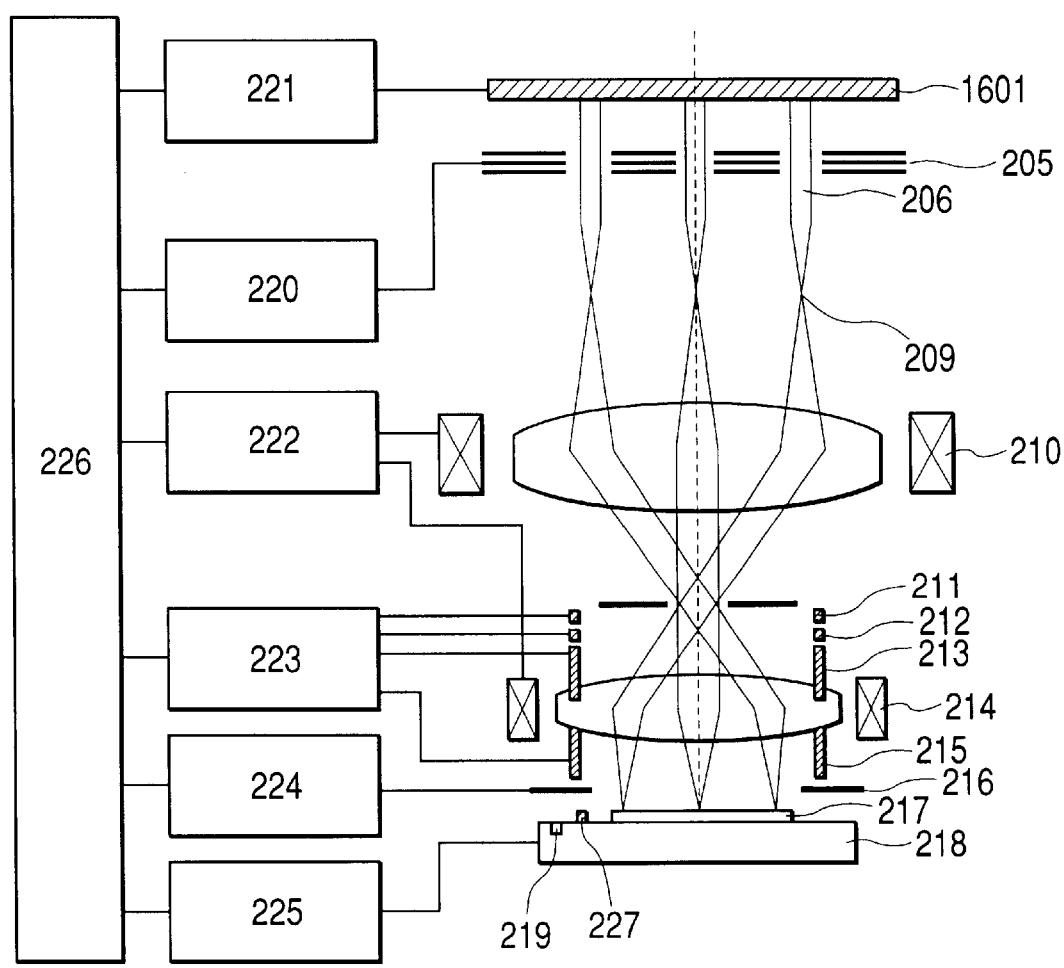
FIG. 16 is a diagram showing an example of an electron beam exposure apparatus of a multi-beam system using a plane-shaped electron source.

FIG. 16 shows an example of a multi-beam type electron beam exposure apparatus using a plane-shaped electron source. The exposure apparatus of the diagram is the same as that of FIG. 2 except for means for generating an electron beam, so that description will be given by using the same reference numerals as those in FIG. 2. The electron beams 206 emitted from a plane-shaped electron source 1601 and separated forms the intermediate images 209 by the lens array 205 driven by the focus control circuit 220. The position in the optical axis direction of each of the intermediate images 209 can be changed by changing the focal length of each of the lens array 205. Whether the electron beam 206 separated can be passed or not can be controlled by changing the positions in the plane-shaped electron source 1601. The following configuration from the intermediate image 209 is the same as that in FIG. 2.

As the plane-shaped electron source, an electron source of an MIN (metal-insulator-metal) type, an MIS (Metal-Insulator-Semiconductor) type, an FEA (Field Emission Array) type in which needle-shaped chips are arranged, and a type in which carbon nanotubes are arranged can be used. In this embodiment, an MIS type in which an insulation layer is formed of $SiO_2$ of 140 Å, and metal layers are formed by Al of 15 Å and Au of 25 Å on the insulating layer is used. When a voltage of 10V is applied to the metal layer in the structure, electrons pass through the metal layer at a current density of about 1 $mA/cm^2$. When the pitches in the electron emission parts in the plane-shaped electron source is set to the same as the pitch 200 $\mu$m of the electron beams and the area: of the electron emission part of each plane-shape dielectron source is of a 100 $\mu$m square, the current amount per electron beam is 100 nA.

Electron emission occurs when a voltage is applied to the metal layer and emission of the electron beam can be controlled by the voltage. The electron emission amount is controlled by the magnitude of an application voltage or time of the voltage application. The controls are performed by the irradiation amount control circuit 221 based on pattern data.

Figure 17:
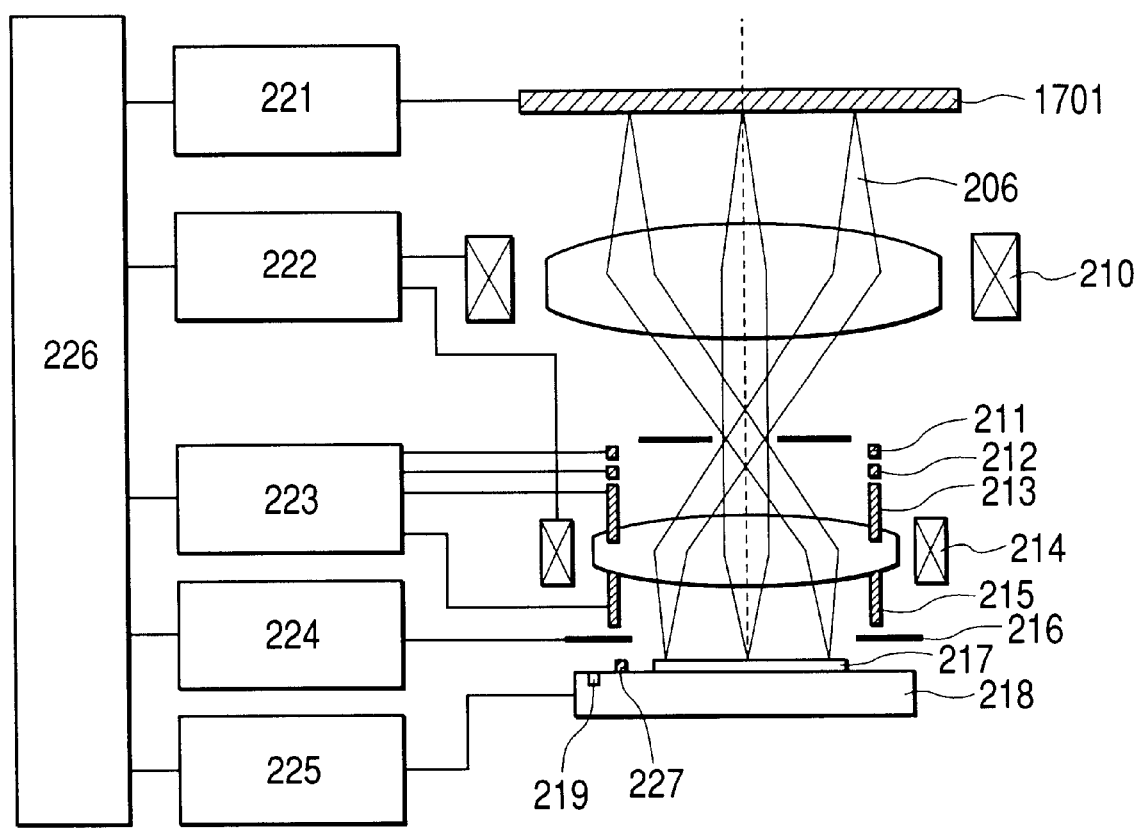
FIG. 17 is a diagram showing another example of the electron beam exposure apparatus of a multi-beam system using a plane-shaped electron source.

In the case of using an electron source having high brightness and a small crossover diameter like an FEA type, reduction of an image by the lens array is unnecessary and an electron source image can be projected directly onto a specimen without forming an intermediate image. FIG. 17 shows the example. FIG. 17 will be described by using the same reference numerals as those of FIG. 16. FIG. 17 is the same as FIG. 16 except that the image of the plane shaped electron source 1701 is in the position corresponding to the position of the intermediate image 209 shown in FIG. 16 and the lens array and the focus control circuit are not provided. The electron source of the FEA type can control the emission of the electron beam and the irradiation amount by controlling a voltage of an extraction electrode. This control is performed by the irradiation amount control circuit 221 on the basis of pattern data.

Figure 18:
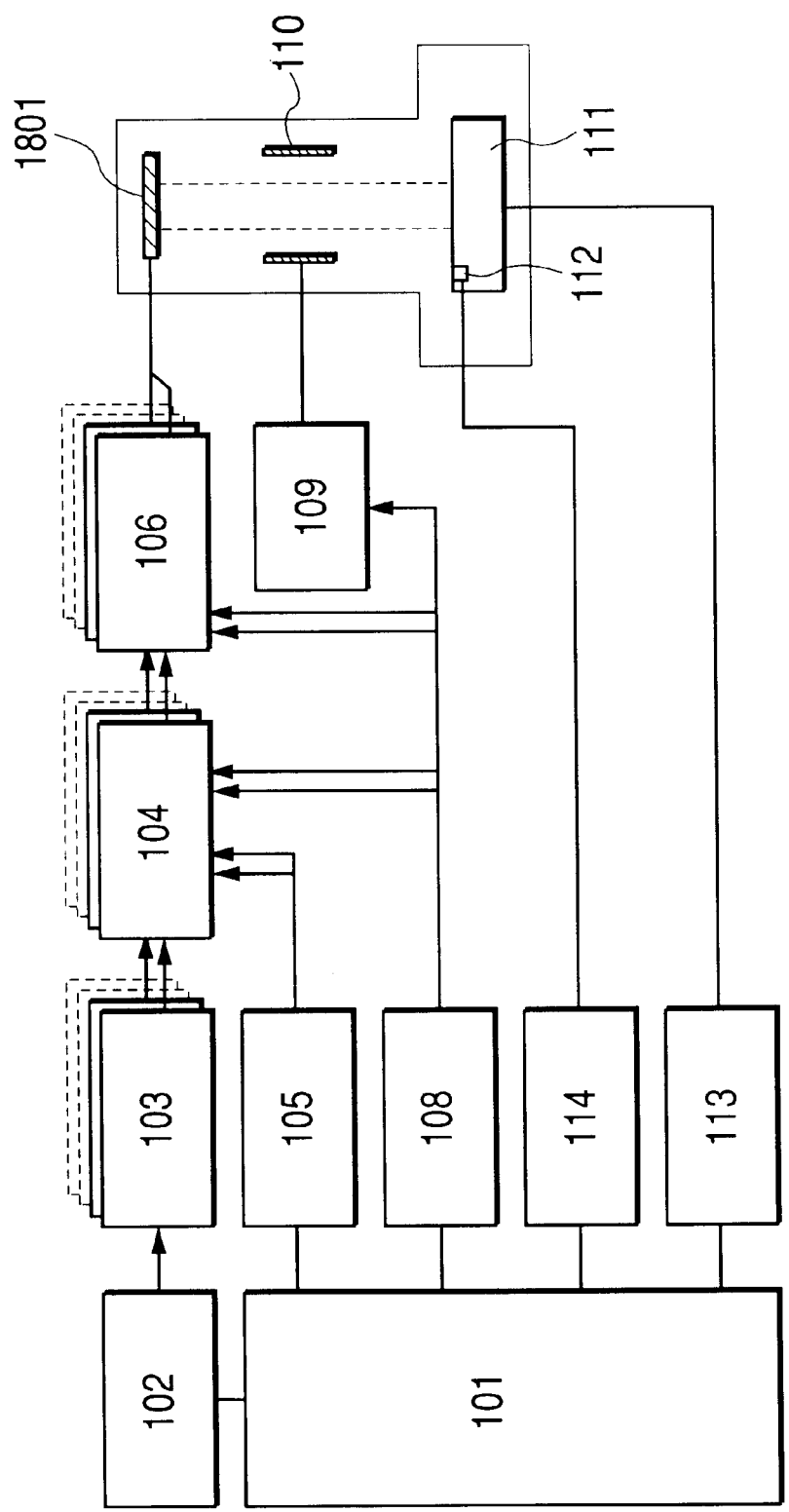
FIG. 18 is a diagram showing an exposure control according to the invention in the case of using a plane-shaped electron source.

FIG. 18 shows the configuration of a controller in the case of using a plane-shaped electron source by using the same reference numerals as those in FIG. 1. FIG. 18 is the same as FIG. 1 except that an output from the irradiation amount control circuit 106 is input to, not the blanking array but, a plane-shaped electron source 1801.

Tenth Embodiment

Figure 19:
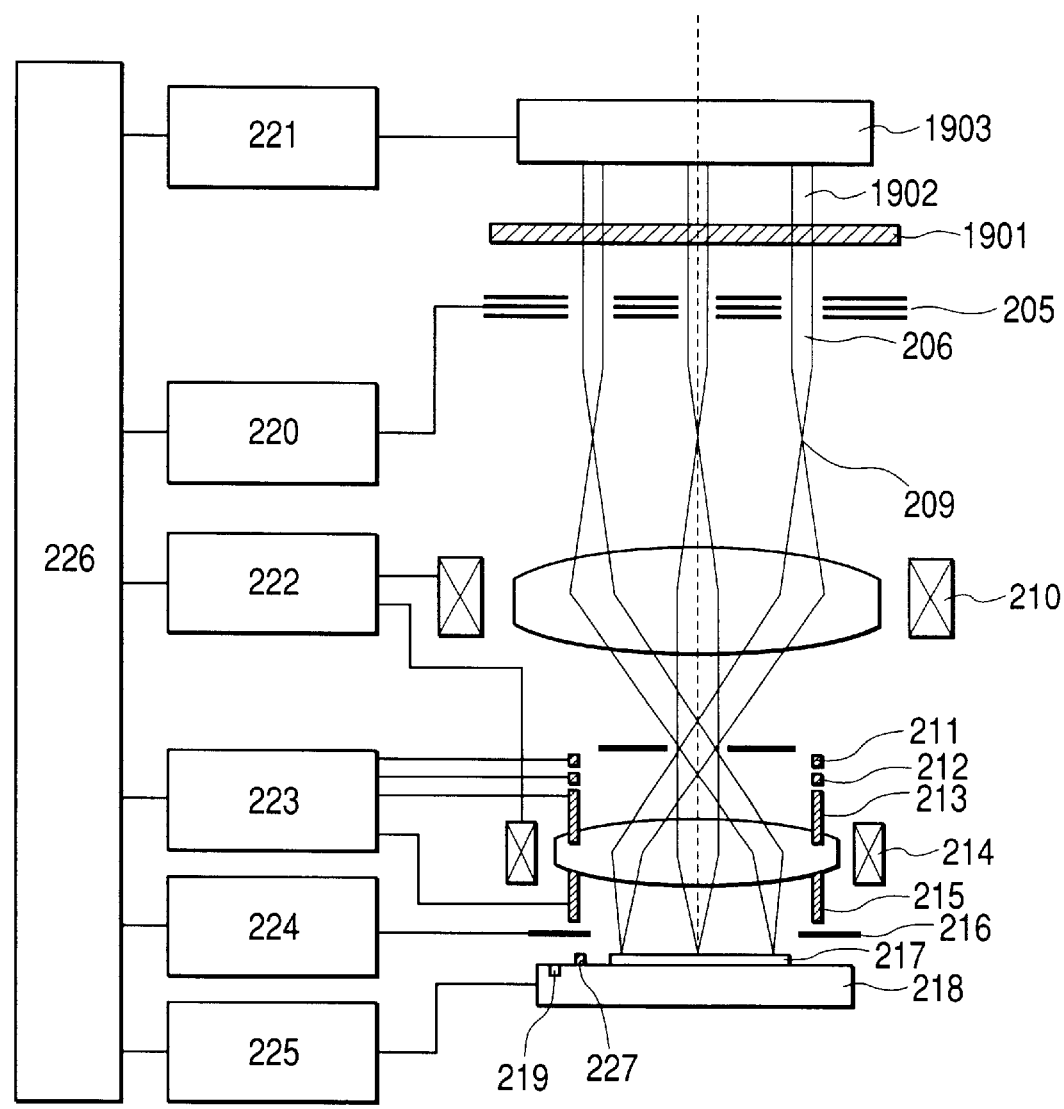
FIG. 19 is a diagram showing an example of an electron beam exposure apparatus of a multi-beam system using an optical excitation electron source.

FIG. 19 shows an example of an electron beam exposure apparatus of a multi-beam type using an optical excitation electron source. The exposure apparatus of FIG. 19 is the same as that of FIG. 16 except for means for generating an electron beam and will be described by using the same reference numerals as those of FIG. 16. Excitation beams 1902 are emitted from an excitation beam generating apparatus 1903 to the optical excitation electron source 1901 from which the separated electron beams 206 are emitted. The configuration after that is the same as that of FIG. 16.

The optical excitation electron source or so-called photo cathode is fabricated by forming a semiconductor layer and a surface absorption layer on a glass substrate. The material of the semiconductor layer is a p-type semiconductor which is a III–V group material such as GaAs, AlAs, InP, InAs, GaP, or GaN, a IV group material such as Si, C, or Ge, or a mixture of them. The surface absorption layer is made of an alkali metal such as Cs or Na, the alkali metal such as Cs or Na and oxygen, an alkali earth metal such as Ba and oxygen, or a mixture of them. By irradiating the optical excitation electron source with a laser diode beam having a wavelength of 800 to 600 nm or an He-Ne laser beam having a wavelength of 633 nm, electrons are emitted. In this case, an AlGaAs film having a thickness of 2 $\mu$m and a GaAs film having a thickness of 1.5 $\mu$m are formed on a glass substrate, a few atom layers made of Cs are formed on the GaAs film, and the resultant is used.

The optical excitation electron source is irradiated with excitation light from the glass substrate face by a laser diode. In this case, a current of about 25 $\mu$A can be obtained with the excitation light of 1 mW. The emission of the electron beam and the emission amount can be controlled by changing emission of the excitation light and intensity of excitation light or irradiation time. The control is performed by the irradiation amount control circuit 221 based on the pattern data.

Figure 20:
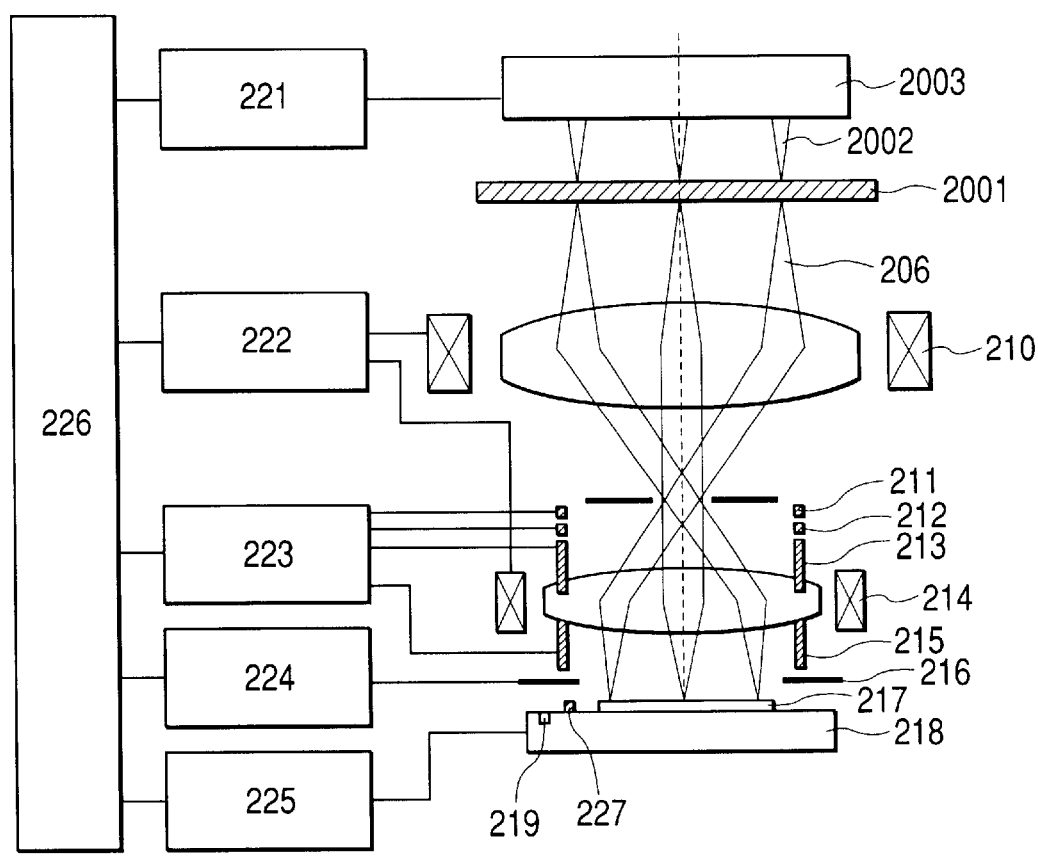
FIG. 20 is a diagram showing another example of the electron beam exposure apparatus of the multi-beam system using an optical excitation electron source.

As described above, the optical excitation electron source can achieve a high current density. Consequently, by converging the excitation light by the optical excitation electron source, the configuration which does not use an intermediate image shown in FIG. 20 can be employed. In FIG. 20, the same reference numerals as those of FIG. 19 are used. An excitation beam 2002 generated by an excitation beam generating apparatus 2003 is converged and is emitted to an optical excitation electron source 2001. The following configuration from the electron beam 206 emitted and separated is the same as FIG. 19.

Figure 21:
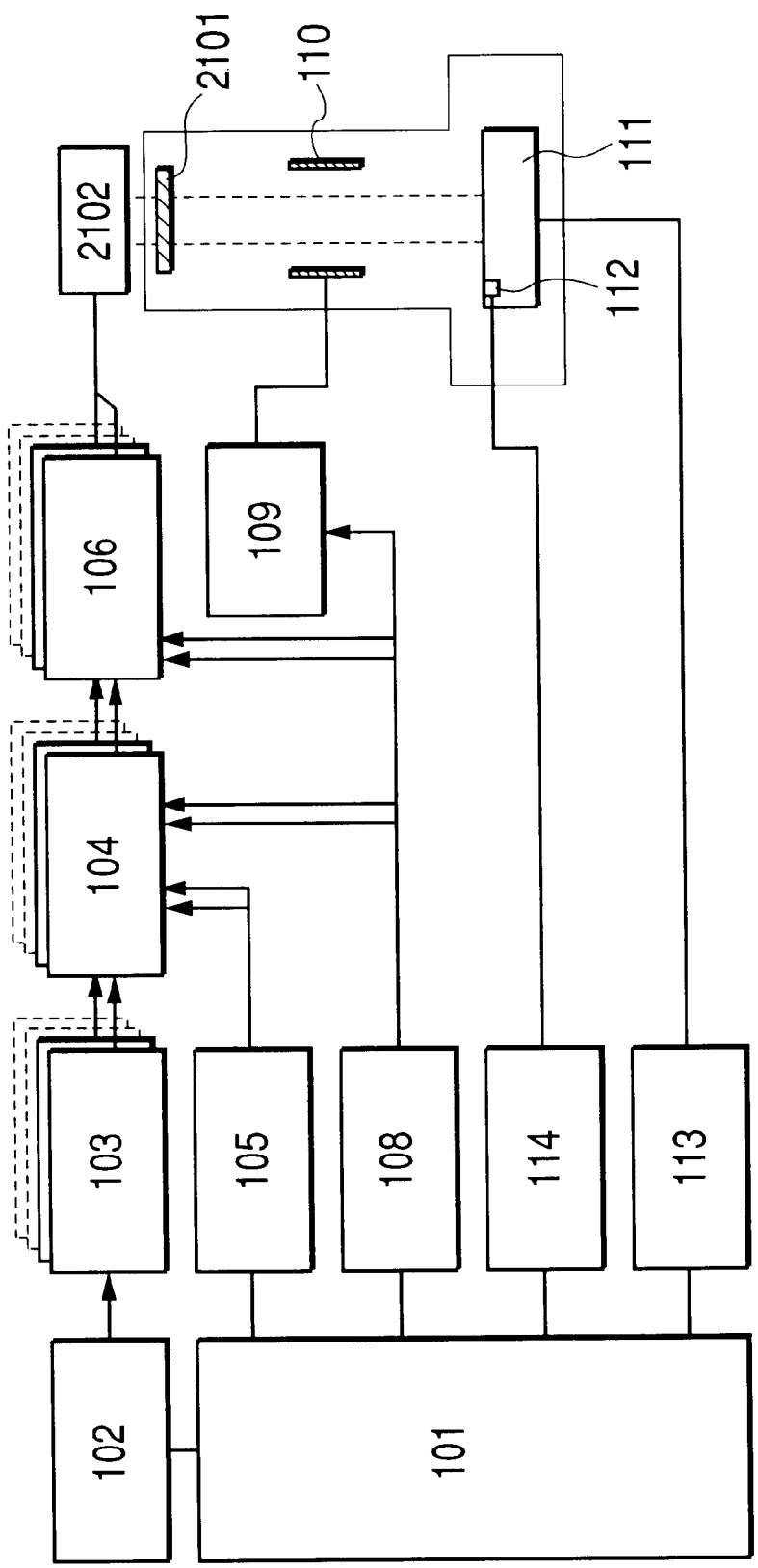
FIG. 21 is a diagram showing an exposure control according to the invention in the case of using an optical excitation electron source.

FIG. 21 shows the configuration of a control apparatus in the case of using the optical excitation electron source. In FIG. 21, the same reference numerals as those of FIG. 18 are used. FIG. 21 is the same as FIG. 18 except that an output from the irradiation amount control circuit 106 is input to not the blanking array but an optical excitation light generating apparatus 2102 and the generated excitation light is emitted to an optical excitation electron source 2101.

As the control apparatuses shown in FIGS. 18 and 21, the control apparatuses shown in FIGS. 7 and 9 can be also applied.

Addition

1. An electron beam exposure method for forming a desired pattern onto a specimen by independently emitting an onto a plurality of electron beams, wherein a deviation between a pattern formed by each of the plurality of electron beams and the desired pattern is controlled by shifting the position of pattern data of the pattern formed by each of the plurality of electron beams.

According to the present invention, high-precision and high-speed exposure and be performed with a simple configuration in a multi-beam type electron beam exposure method and apparatus.

What is claimed is:

1. An electron beam exposure method for forming a desired pattern on a specimen by independently controlling emission and scanning of a plurality of electron beams, comprising:

a step of adding a second region corresponding to a deflection region margin to the periphery of a first region including said desired pattern to be formed by each of said plurality of electron beams, thereby setting a pattern of a third region;

a step of obtaining a positional shift amount of pattern data of a pattern formed by each of said plurality of electron beams from pattern data of said desired pattern in said third region; and a step of deflecting each of said plurality of electron beams in accordance with aid positional shift amount in said third region.

2. An electron beam exposure apparatus for forming a desired pattern by independently controlling emission of a plurality of electron beams so as to fall on a specimen via a projection optical system including a deflector, comprising:

a memory for storing pattern data of said desired pattern to be formed by each of said plurality of electron beams;

a shift amount computing circuit for computing a positional shift amount of pattern data of a pattern formed by each of said plurality of electron beams from the pattern data of said desired pattern; and deflection control means for deflecting each of said plurality of electron beams in accordance with said positional shift amount.

3. An electron beam exposure apparatus for forming a desired pattern by independently controlling emission of a plurality of electron beams so as to fall on a specimen via a projection optical system including a deflector, comprising:

a memory for storing pattern data of a third region obtained by adding a second region corresponding to a deflection region margin to the periphery of a first region including said desired pattern to be formed by each of said plurality of electron beams;

a shift amount computing circuit for computing a positional shift amount of pattern data of a pattern formed by each of said plurality of electron beams in said third region from the pattern data of said desired pattern; and deflection control means for deflecting each of said plurality of electron beams in accordance with said positional shift amount in the range of said third region.

4. The electron beam exposure apparatus according to claim 2, wherein the positional shift amount of said pattern data includes an amount of correcting variations in intervals of said plurality of electron beams, or an amount of correcting appositional shift of each of said plurality of electron beams, which occurs due to a whole electron optical system including said projection optical system or due to fluctuations in height of said specimen.

5. The electron beam exposure apparatus according to claim 2, wherein computation of the positional shift amount of said pattern in said shift amount computing circuit and a deflecting operation in said deflection control means are performed synchronously with each other.

6. The electron beam exposure apparatus according to claim 2, wherein said shift amount computing circuit computes a positional shift amount of said pattern by computation including pattern data linear interpolation, and converts a result of said linear interpolation to an irradiation amount of an electron beam.

7. The electron beam exposure apparatus according to claim 2, wherein said shift amount computing circuit sets said positional shift amount by depending on a position in which each of said plurality of electron beams is deflected.

8. The electron beam exposure apparatus according to claim 3, wherein a size of said second region to be added to the periphery of the first region including said desired pattern to be formed by each of said plurality of electron beams is changeable depending on the deflection position for exposure in said memory.

* * * * *